(12) United States Patent
Ikeda

(10) Patent No.: US 6,441,662 B2
(45) Date of Patent: Aug. 27, 2002

(54) DLL CIRCUIT THAT CAN PREVENT ERRONEOUS OPERATION

(75) Inventor: Yutaka Ikeda, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/725,038

(22) Filed: Nov. 29, 2000

(30) Foreign Application Priority Data

May 30, 2000 (JP) ............................................ 12-160078

(51) Int. Cl.⁷ ................................................ H03L 7/00
(52) U.S. Cl. ...................................... 327/160; 327/161
(58) Field of Search ................................. 327/151, 158, 327/156, 153, 160, 147, 149, 152, 161

(56) References Cited

U.S. PATENT DOCUMENTS 5,173,617 A * 12/1992 Alsup et al. ................. 327/158
5,877,641 A * 3/1999 Ziegler et al. ............... 327/156
6,125,157 A * 9/2000 Donnelly et al. ............ 375/371

* cited by examiner

Primary Examiner—Timothy Callahan
Assistant Examiner—Cassandra Cox
(74) Attorney, Agent, or Firm—McDermott, Will, Emery

(57) ABSTRACT

A DLL circuit includes a counter control circuit. The counter control circuit includes an inverter, a NAND gate, a shift register, a clocked inverter, and a NOR gate. When a reset signal RST of an H level, or a smallest address signal CMIN indicating the smallest value of the address is input, the counter control circuit forces a signal REV to be switched to an H level and generates a counter control signal ADD and a signal EN of an H level, whereby the counter enters a force up mode. As a result, the delay clock CLKD can be set in phase with a reference clock CLK stably.

14 Claims, 25 Drawing Sheets

DLL CIRCUIT THAT CAN PREVENT ERRONEOUS OPERATION

BACKGROUND OF THE INVENTION

1. Field of the Invention

The present invention relates to DLL (Delayed Locked Loop) circuits effective for use in a semiconductor integrated circuit, particularly to a DLL circuit of high reliability.

2. Description of the Background Art

A conventional DLL circuit 200 that provides consistency between the phase of a delay clock and the phase of a reference clock includes a control clock generation circuit 210, a phase comparator 220, a filter 230, a counter control circuit 240, a counter 250 and a delay circuit 260, as shown in FIG. 21. Control clock generation circuit 210 receives a reference clock CLK from an IN terminal to generate control clocks SET and CNT.

Referring to FIG. 22, phase comparator 220 includes NOR gates 221 and 223, NAND gates 226, 227, 229 and 231–234, shift registers 222 and 224, and inverters 225 and 228. Phase comparator 220 multiplies reference clock CLK and delay clock CLKD by 2 to generate respective multiplied reference clock CLK2 and delay clock CLKD2 and compares the phase of multiplied delay clock CLKD2 with the phase of multiplied reference clock CLK2. The comparison result is output from an UP terminal. It is to be noted that a DN terminal is not used.

Filter 230 is driven in synchronization with reference clock CLK to generate and output signals PUP and PDN according to the comparison result from phase comparator 220.

With reference to FIG. 23, counter control circuit 240 includes inverters 241–243, a NOR gate 244, and shift registers 245 and 246. Counter control circuit 240 is driven in synchronization with control clock SET from control clock generation circuit 210 to generate a counter control signal ADD and a signal EN with signals PUP and PDN generated by filter 230 as input signals according to the comparison result of phase comparator 220.

Counter 250 is driven in synchronization with control clock CNT from control clock generation circuit 210 to count up/down according to input signals ADD and EN from counter control circuit 240 to generate addresses a0–a5. At this stage, counter 250 counts up and down when signal ADD is at an H level (logical high) and an L level (logical low), respectively, with signal EN as an input signal. Delay circuit 260 delays reference clock CLK by a predetermined amount to output delay clock CLKD according to addresses a0–a5 from counter 250.

Delay circuit 260 delays reference clock CLK by a predetermined amount according to addresses a0–a5 from counter 250 to output delay clock CLKD.

In DLL circuit 200, a counter control signal ADD that controls the count of counter 250 is generated according to the comparison result between the phase of delay clock CLKD and the phase of reference clock CLK. Count is effected up/down according to the generated counter control signal ADD to provide addresses a0–a5. The phase of reference clock CLK is delayed according to addresses a0–a5, and the phase of delay clock CLKD is made to be consistent with the phase of reference clock CLK.

The reason why phase comparator 220 compares the phase of delay clock CLKD2 corresponding to delay clock CLKD multiplied by 2 with the phase of reference clock CLK2 corresponding to reference clock CLK multiplied by 2 is to prevent the comparison result from attaining an L level at each rise of reference clock CLK2, as shown in FIG. 24, to suppress erroneous operation of DLL circuit 200.

Since phase comparator 220 forming conventional DLL circuit 200 compares the phases of reference clock CLK and delay clock CLKD after they are multiplied, the L level cycle of multiplied delay clock CLKD2 becomes longer when one component 251 in delay clock CLKD is missing, as shown in FIG. 25. There was problem that the comparison result attains an L level at the rise of reference clock CLK2, whereby DLL circuit 200 operates erroneously.

Counter control circuit 240 forming conventional DLL circuit 200 employs the structure of generating counter control signal ADD and signal EN according to signals PUP and PDN output from filter 230. If a frequency-multiply circuit is not used, the comparison result will attain an L level when addresses a0–a5 output from counter 250 take the smallest values, whereby counter control signal ADD and signal EN will be generated to cause counter 250 to count down. As a result, there was a problem that counter 250 cannot generate addresses a0–a5 properly.

SUMMARY OF THE INVENTION

In view of the foregoing, an object of the present invention is to provide a DLL circuit that can have the phase of delay clock CLKD coincide with the phase of reference clock CLK stably when reset is effected or when phase comparison of the delay clock with respect to reference clock exhibits an L level with addresses a0–a5 taking the smallest values.

According to an aspect of the present invention, a DLL circuit includes a control clock generation circuit generating a first control clock according to a reference clock and a second control clock having a phase difference with respect to the first control clock, a phase comparator comparing the phase of the delay clock with the phase of the reference clock, a filter providing a control signal applied with weight corresponding to the comparison result of the phase comparator, a counter control circuit driven in synchronization with the first control clock to generate a counter control signal according to the control signal, a counter driven in synchronization with the second control clock to count up/down according to the counter control signal to provide first and second addresses and a smallest address signal activated when the first and second addresses take the smallest values and setting the address to the smallest value in response to a reset signal, a first delay circuit generating first and second signals having a predetermined phase difference according to a reference clock and generating a fine adjustment clock whose phase is present between the phase of the first signal and the phase of the second signal according to the generated first and second signals and first address, and a second delay circuit delaying the fine adjustment clock by an integral multiple of a predetermined amount to output a delay dock according to the second address. The counter control circuit outputs a counter control signal activated to force the counter to count up when a reset signal is input or when an activated smallest address signal and an output signal of a filter that causes the counter to count down are input.

According to the DLL circuit of the present invention, a counter control signal controlling the count of the counter is generated according to the comparison result between the phase of the delay clock and the phase of the reference clock. The counter counts up/down according to the generated counter control signal to generate first and second addresses. A fine adjustment dock is generated with the phase of the reference clock CLK delayed within a range of a predetermined amount T according to the first address. A delay clock is generated delaying the fine adjustment dock by an integral multiple of the predetermined amount T according to the second address. When a reset signal is input, or when the comparison result of the phase comparator provides an L level in the case where the first and second addresses take the smallest values, the counter is forced to count up. Therefore, first and second addresses can be generated properly even when reset, or when the comparison result of the phase comparator provides an L level in the case where the address takes the smallest value. Accordingly, the phase can be set in phase precisely. Furthermore, the delay clock can be set in phase with the reference clock at the high accuracy of within a predetermined amount T.

Preferably, the counter control circuit generates a force up signal rendered active according to a reset signal or an output signal of the filter that causes the counter to count down, and renders the counter control signal active according to the generated force up signal.

In the DLL circuit, the counter proceeds to the force up mode when a reset signal or a control signal corresponding to the comparison result of an L level is applied to the counter control circuit. Therefore, the first and second addresses can be generated always correctly.

Preferably, the counter control circuit renders the force up signal inactive at the elapse of two cycles of the first control clock after the output of the filter that causes the counter to count up is rendered active.

In the DLL circuit, the force up mode is canceled at the elapse of two cycles of the first control clock after the comparison result of the phase comparator attains an H level. Thus, in response to a reset signal or a control signal corresponding to a comparison result of an L level, the force up mode is promptly entered and then canceled promptly after the counter counts up.

Preferably, the first delay circuit generates a fine adjustment clock by applying weight to the first and second signals according to the first address.

The first delay circuit applies weight on the first and second signals having a phase difference of a predetermined amount T according to the first address and generates a fine adjustment clock whose phase is present between the phase of the first signal and the phase of the second signal. Therefore, the phase of the delay clock can be made to match the phase of the reference dock at a high accuracy of within a predetermined amount T.

Preferably, the first delay circuit includes a first inverter circuit that applies weight to the first signal by determining the size, and a second inverter circuit having an output terminal connected to the output terminal of the first inverter circuit to apply weight to the second signal by determining the size. The counter provides a first address to determine the size of the first and second inverter circuits to the first delay circuit.

In the first delay circuit, the size of the first and second inverter circuits are determined according to the first address from the counter. Weight is applied to the first and second signals having a phase difference of a predetermined amount T according to the determined size. Therefore, weight can be easily applied to the first and second signals by using an inverter whose size is variable. As a result, the phase of the reference dock can be adjusted in high accuracy within the range of a predetermined amount T.

Preferably, the first delay circuit includes a plurality of first inverters connected in parallel, each having a different size, and a plurality of second inverters of different sizes connected in parallel, and having an output terminal connected to the output terminal of the plurality of first inverters. The counter provides a first address to the first delay circuit to selectively render the first and second inverters active.

In the first delay circuit, a portion of the plurality of first and second inverters having different sizes and connected in parallel is selectively rendered active according to the first address from the counter. Then, weight is applied to the first and second signals having the phase difference of a constant amount T.

Weight can be easily applied to the first and second signals by just connecting inverters of different sizes in parallel. As a result, the phase of the reference clock can be adjusted at high accuracy within the range of a predetermined amount T.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
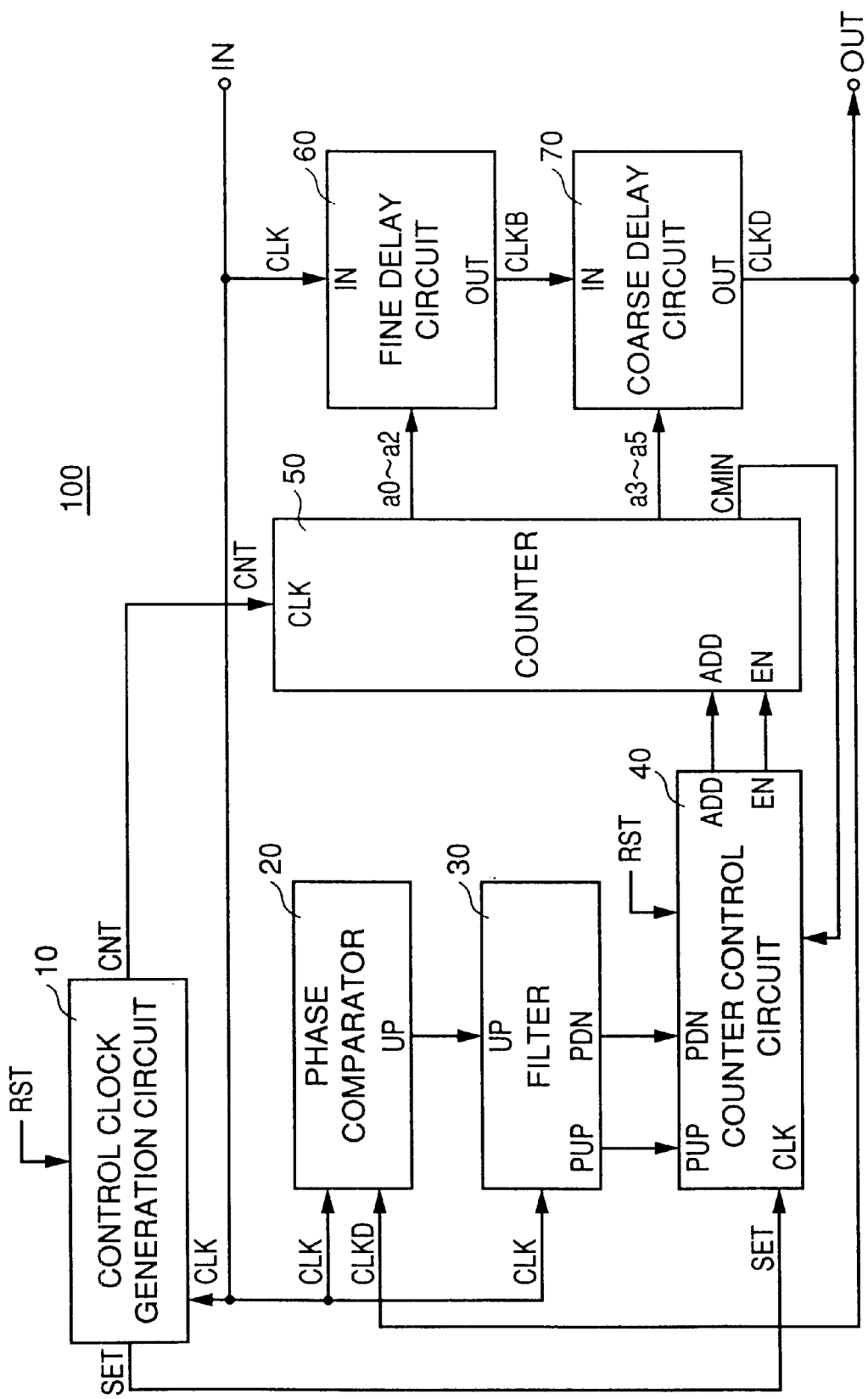
FIG. 1 is a schematic block diagram of a DLL circuit according to the present invention.

An embodiment of the present invention will be described in detail hereinafter with reference to the drawings. In the drawings, the same or corresponding components have the same reference character allotted, and description thereof will not be repeated.

Referring to FIG. 1, a DLL circuit 100 of the present invention includes a control clock generation circuit 10, a phase comparator 20, a filter 30, a counter control circuit 40, a counter 50, a fine delay circuit 60 and a coarse delay circuit 70.

Control clock generation circuit 10 generates control clocks SET and CNT according to a reset signal RST and a reference clock CLK from an input terminal IN. Control clock SET is provided to counter control circuit 40 whereas control clock CNT is provided to counter 50.

Phase comparator 20 compares the phase of delay clock CLKD with the phase of reference clock CLK to output the comparison result thereof. Filter 30 is driven in synchronization with reference clock CLK to generate signals PUP and PDN according to the comparison result from phase comparator 20. The generated signals PUP and PDN are provided to counter control circuit 40.

Counter control circuit 40 is driven in synchronization with control clock SET from control clock generation circuit 10 to generate counter control signal ADD and signal EN according to signals PUP and PDN from filter 30. The generated signals ADD and EN are provided to counter 50. When a reset signal RST is input or when an activated smallest address signal CMIN from counter 50 and a signal PDN from counter 30 corresponding to the comparison result of an L level of phase comparator 20 are input, counter control circuit 40 renders counter control signal ADD active to force counter 50 to count up. The activated counter control signal ADD is provided to counter 50.

Counter 50 is driven in synchronization with control clock CNT from control clock generation circuit 10 to count up/down according to counter control signal ADD to generate addresses a0–a5. Generated addresses a0–a5 are provided to a fine delay circuit 60 whereas addresses a3–a5 are provided to a coarse delay circuit 70. Counter 50 provides to counter control circuit 40 smallest address signal CMIN rendered active when addresses a0–a5 take the smallest values. Counter 50 forces the count up when an activated counter control signal ADD is input to generate addresses a0–a5.

Fine delay circuit 60 functions to delay the clock minutely, and receives reference clock CLK and addresses a0–a2 from counter 50 to generate and output a fine adjustment clock CLKB from reference clock CLK in a manner that will be described afterwards Coarse delay circuit 70 functions to delay the clock roughly, and receives fine adjustment clock CLKB from fine delay circuit 60 and addresses a3–a5 from counter 50 to delay fine adjustment clock CLKB by an integral multiple of a predetermined amount by a method that will be described afterwards to output a delay clock CLKD. Delay clock CLKD is applied to phase comparator 20, and also output through an output terminal OUT.

Figure 2:
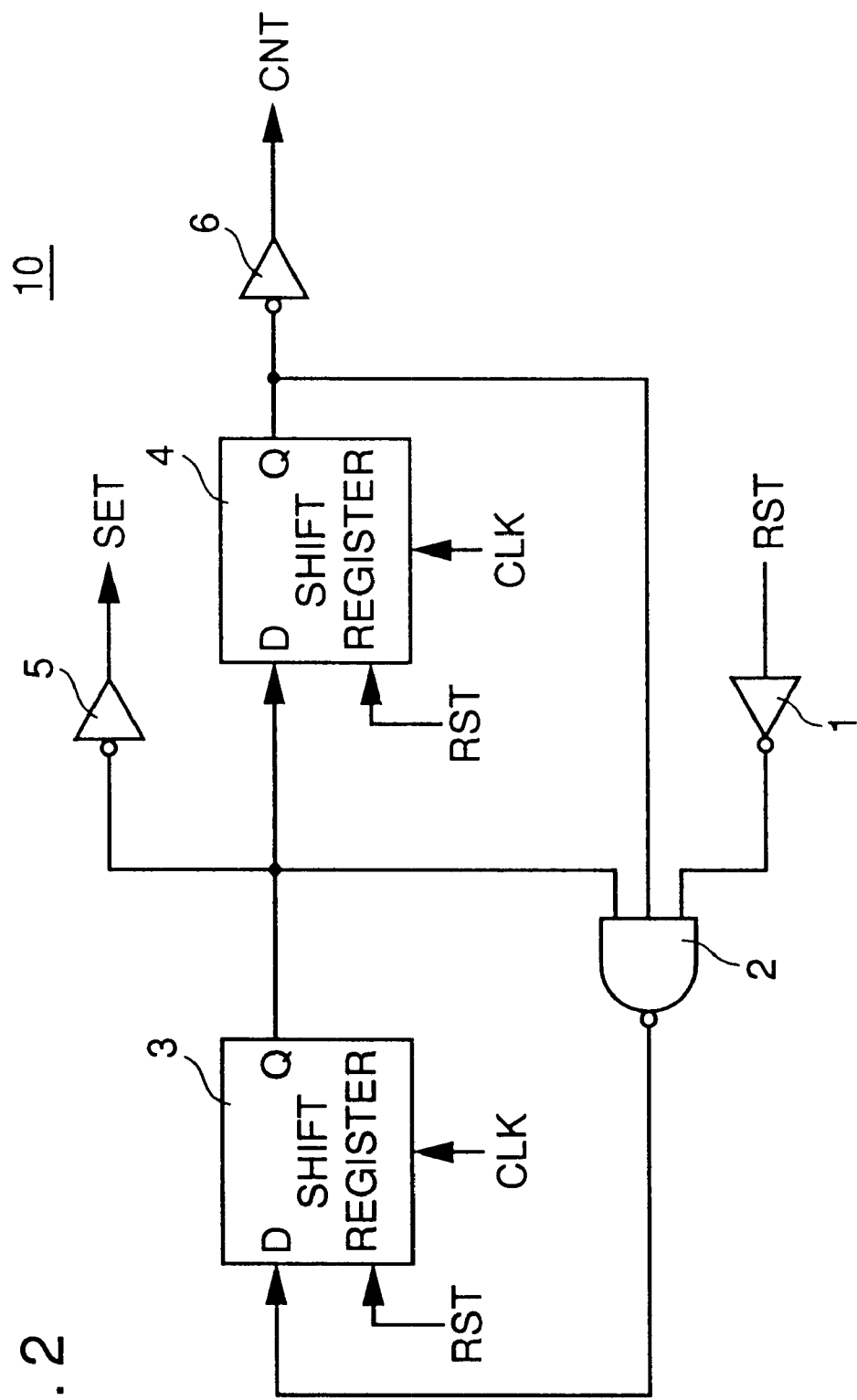
FIG. 2 is a circuit diagram showing a structure of a control clock generation circuit of the DLL circuit of FIG. 1.

Referring to FIG. 2, control clock generation circuit 10 includes inverters 1, 5 and 6, a NAND gate 2, and shift registers 3 and 4.

Figure 3:
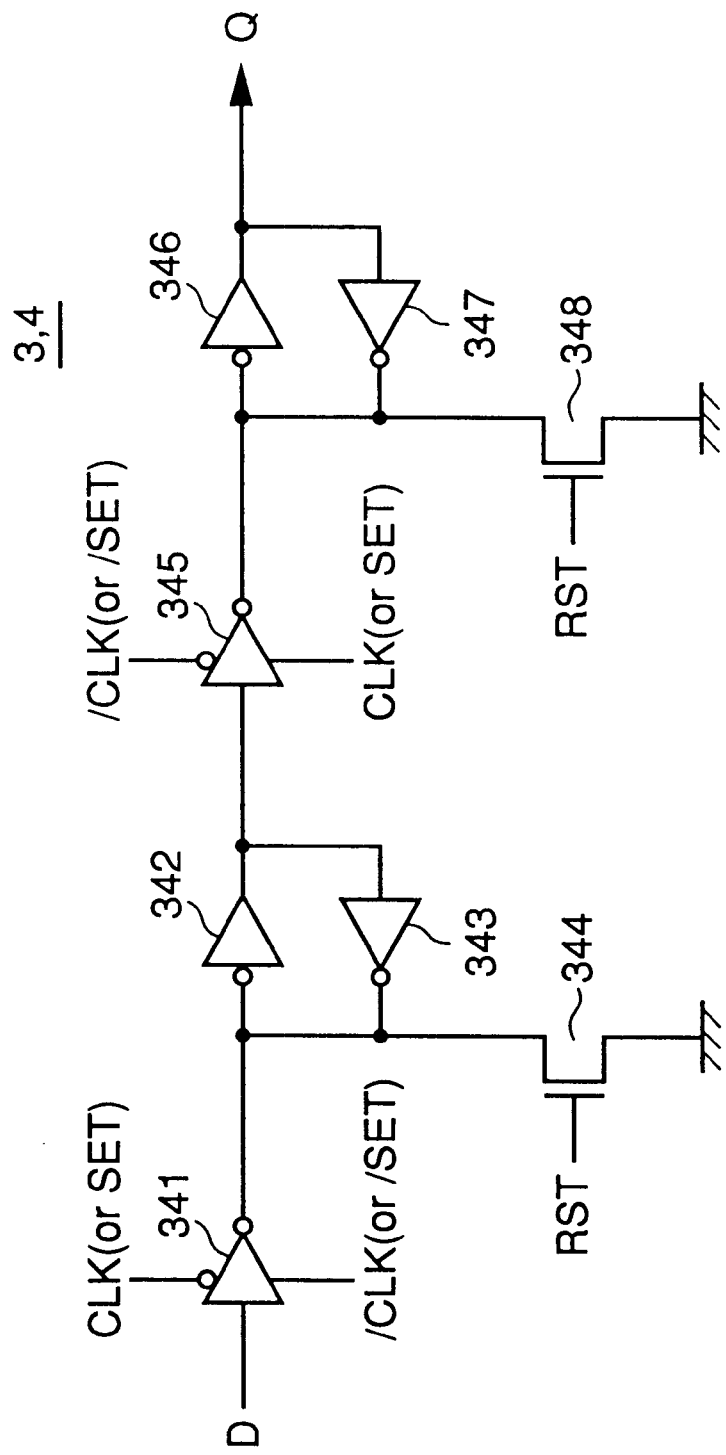
FIG. 3 is a circuit diagram showing a structure of a shift register.

Referring to FIG. 3, shift registers 3 and 4 include clocked inverters 341 and 345, inverters 342, 343, 346 and 347, and N channel MOS transistors 344 and 348. Clocked inverters 341 and 345 are driven according to reference clock CLK. When clocked inverter 341 is driven, docked inverter 345 is not driven. When docked inverter 345 is driven, clocked inverter 341 is not driven. N channel MOS transistors 344 and 348 are turned on/off according to reset signal RST.

Figure 4:
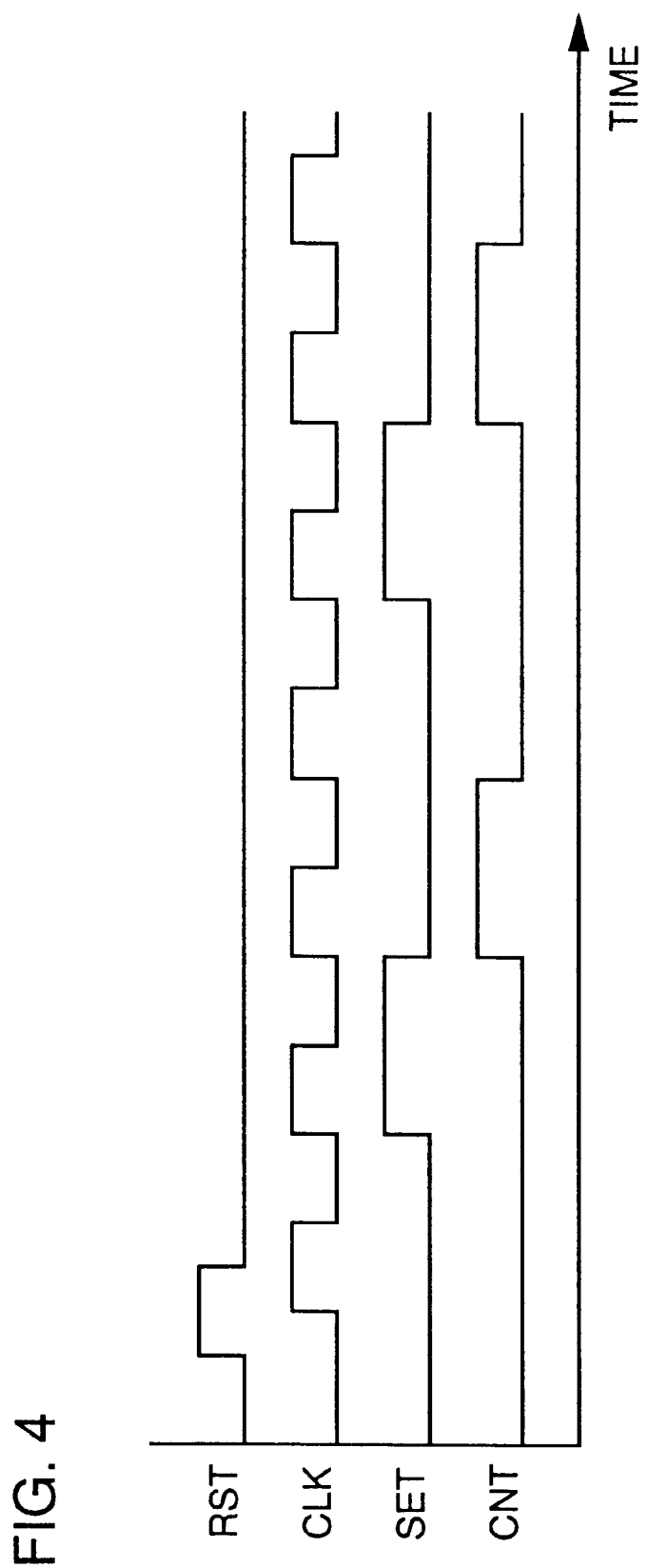
FIG. 4 is a timing chart of a control clock generation circuit.

Referring to FIGS. 2 and 4, control clock generation circuit 10 receives reset signal RST and reference clock CLK to generate a control clock SET having a cycle three times that of reference clock CLK and a ratio 1:2 of an H level to an L level. Control clock generation circuit 10 generates a control clock CNT having a cycle identical to that of control clock SET, and having a phase delayed by one cycle of reference clock CLK with respect to control clock SET. The present invention is not limited to control clock generation circuit 10 generating control clock CNT delayed by one cycle with respect to control clock SET. In general, a control clock CNT having a phase difference with respect to control clock SET can be generated.

Figure 5:
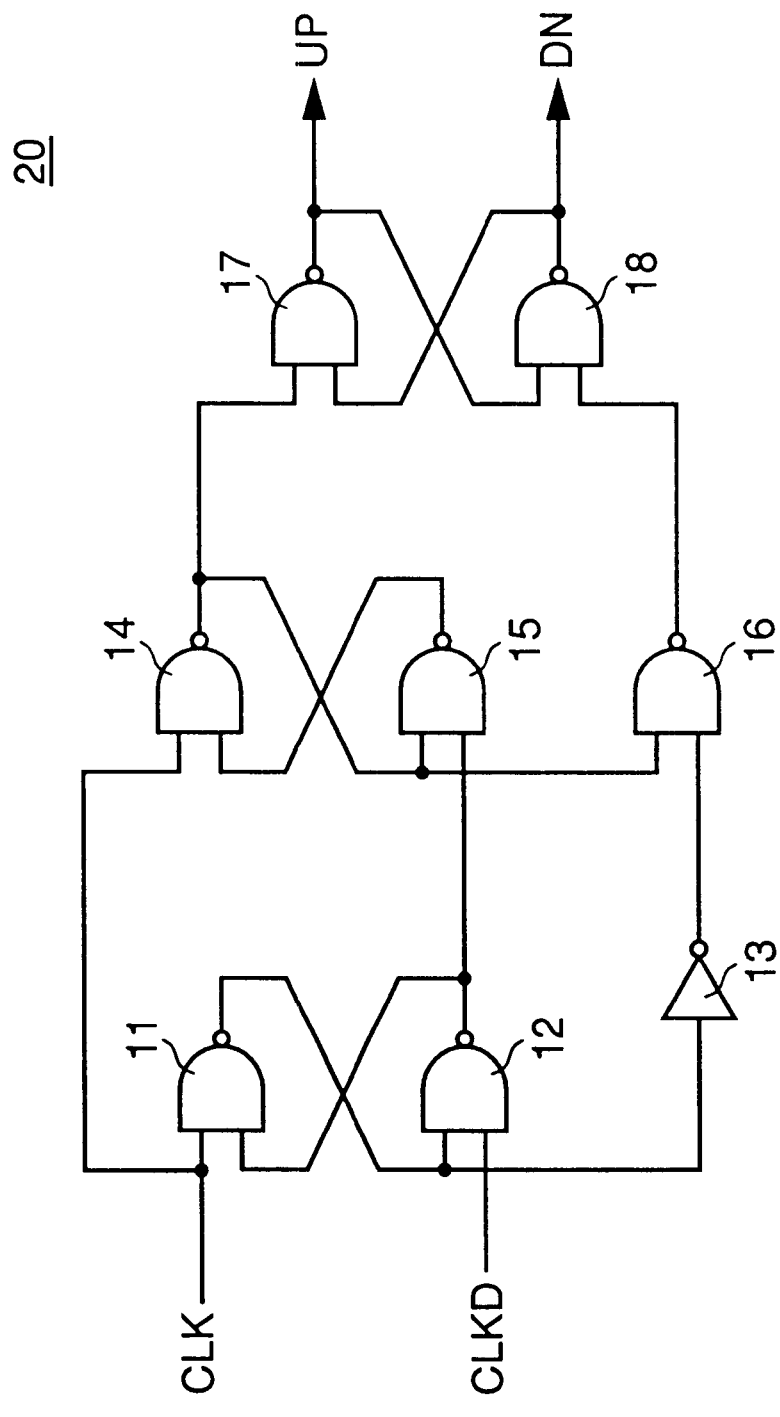
FIG. 5 is a circuit diagram showing a structure of a phase comparator of the DLL circuit of FIG. 1.

Referring to FIG. 5, phase comparator 20 includes NAND gates 11, 12, and 14–18, and an inverter 13. NAND gates 11 and 12, NAND gates 14 and 15, and NAND gates 17 and 18 respectively function as a flip flop. Accordingly, phase comparator 20 compares the phase of delay clock CLKD with the phase of reference dock CLK to output a signal from an UP terminal corresponding to the phase delay of delay clock CLKD. It is to be noted that the DN terminal is not used in the present embodiment.

Figure 6:
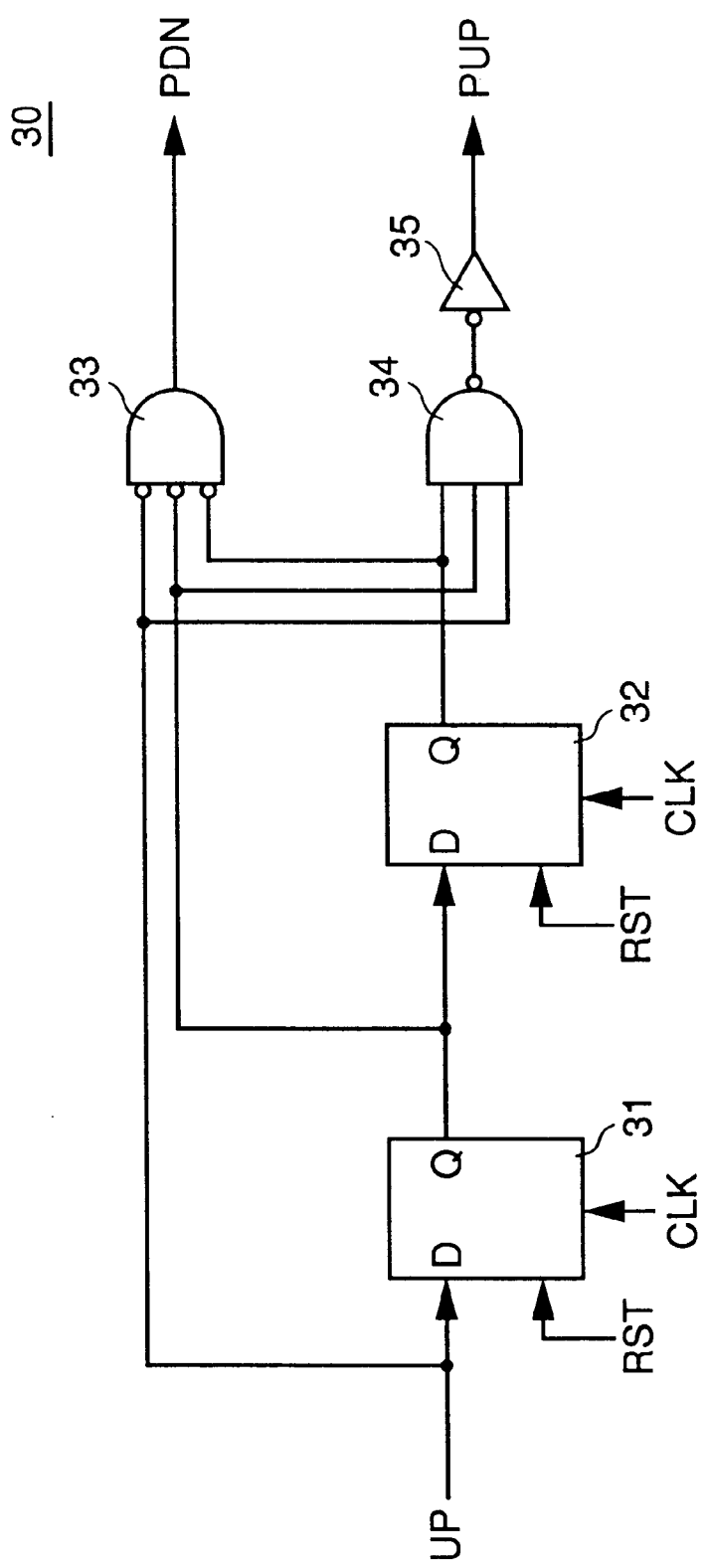
FIG. 6 is a circuit diagram showing structure of a filter of the DLL circuit of FIG. 1.

Referring to FIG. 6, filter 30 includes shift registers 31 and 32, NAND gates 33 and 34, and an inverter 35. Shift registers 31 and 32 have a structure as shown in FIG. 3 to be driven in synchronization with reference clock CLK. Filter 30 responds to the comparison result of phase comparator 20 to output signals PUP and PDN corresponding to the comparison result when the comparison result exhibits the same result over three cycles of reference dock CLK. More specifically, filter 30 outputs a signal PUP of an H level and a signal PDN of an L level when the comparison result of phase comparator 20 exhibits an H level, and outputs a signal PUP of an L level and a signal PDN of an H level when the comparison result exhibits an L level.

Figure 7:
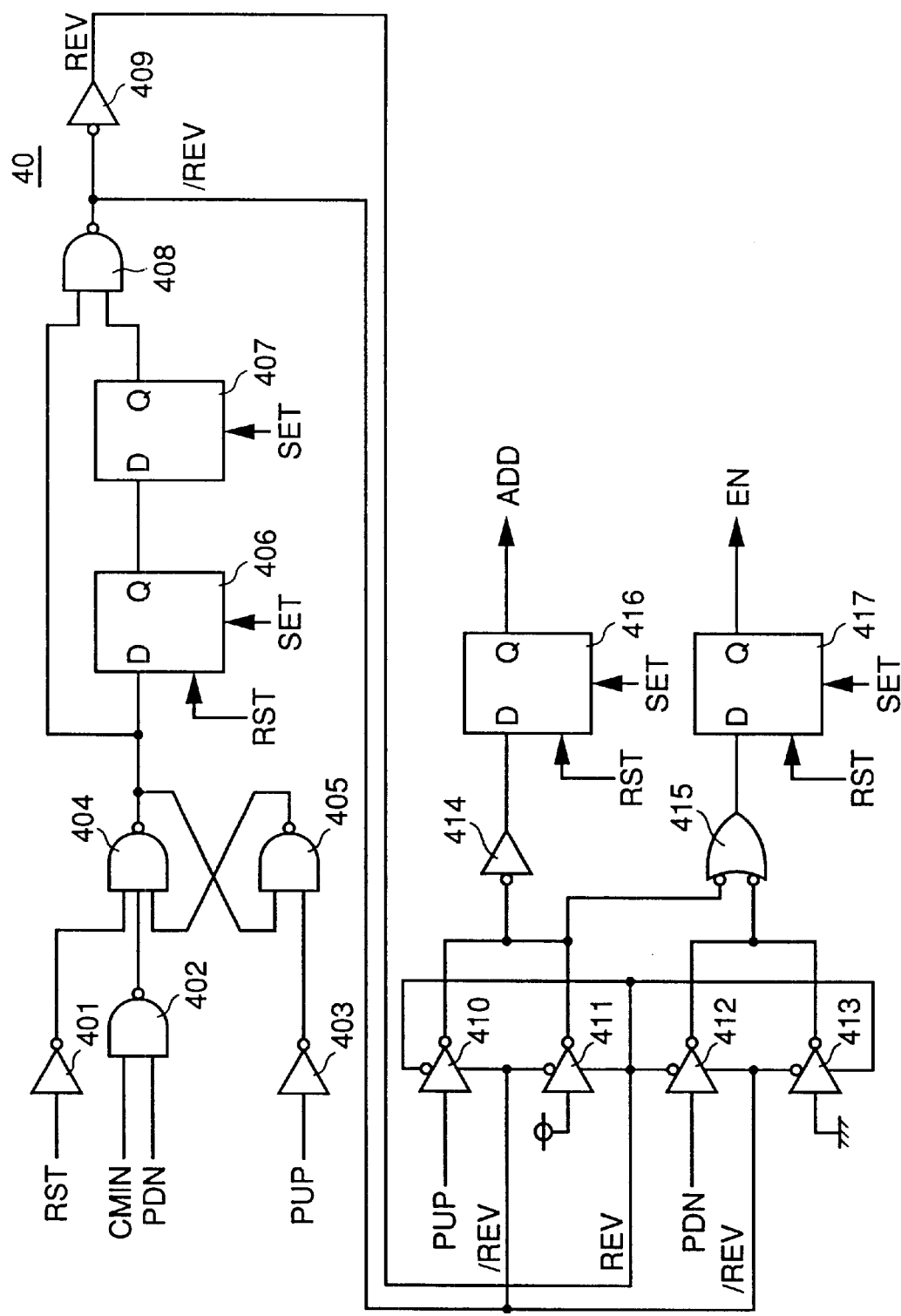
FIG. 7 is a circuit diagram showing a structure of a counter control circuit of the DLL circuit of FIG. 1.

Referring to FIG. 7, counter control circuit 40 includes inverters 401, 403, 409 and 414, NAND gates 402, 404, 405 and 408, shift registers 406, 407, 416 and 417, docked inverters 410–413, and a NOR gate 415. Shift registers 406, 407, 416 and 417 have a structure as shown in FIG. 3 to be driven in synchronization with control dock SET. Counter control circuit 40 receives reset signal RST, smallest address signal CMIN from counter 50, and signals PUP and PDN from filter 30 to generate signals REV and /REV. Counter control signal ADD and signal EN are generated according to signals REV and /REV and signals PUP and PDN from filter 30, which are provided to counter 50.

Figure 8:
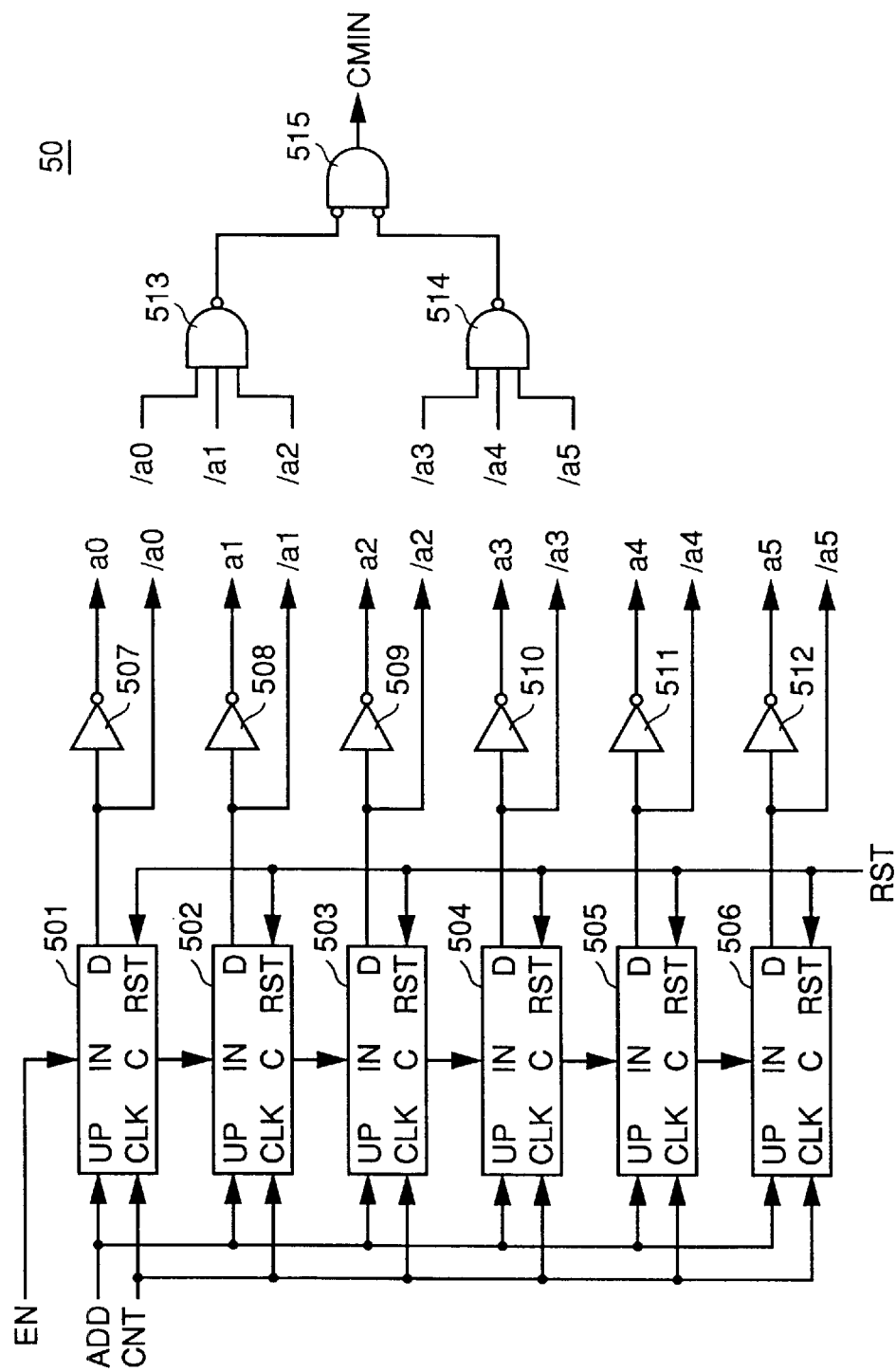
FIG. 8 is a circuit diagram showing a structure of a counter in the DLL circuit of FIG. 1.

Referring to FIG. 8, counter 50 includes counter units 501–506, inverters 507–512, NAND gates 513 and 514, and a NOR gate 515. Each of counter units 501–506 includes inverters 516, 523, 524, 527, 528, 529 and 532, N channel MOS transistors 517, 519, 522, 526, 530 and 533, P channel MOS transistors 518, 520, 531 and 534, and a NOR gate 535, as shown in FIG. 9.

Figure 9:
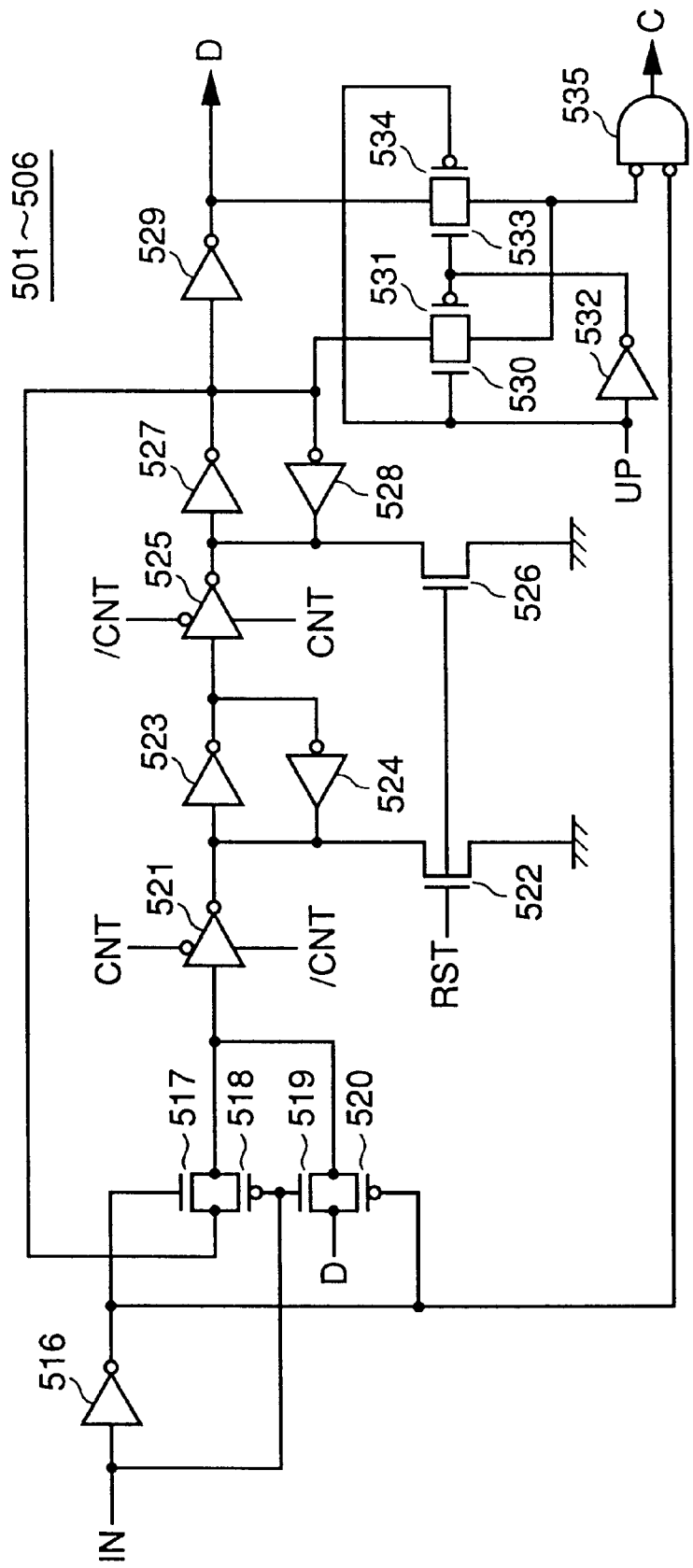
FIG. 9 is a circuit diagram showing a structure of counter unit of the DLL circuit of FIG. 8.
Figure 10:
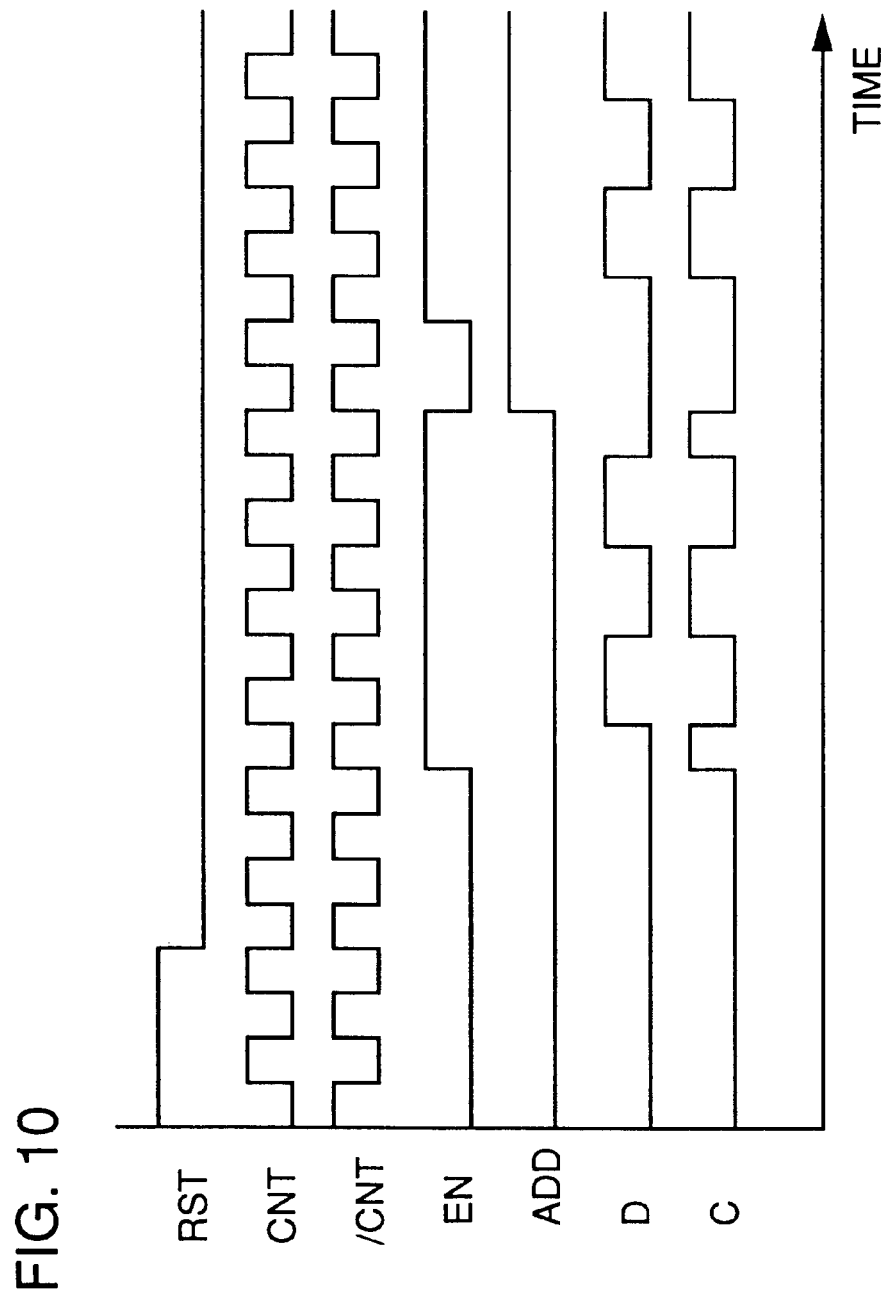
FIG. 10 is a timing chart of a counter unit.

When counter control signal ADD and signal EN from counter control circuit 40, control clocks CNT and /CNT and reset signal RST are input to the counter unit of FIG. 9, a carrier signal C and a data signal D as shown in FIG. 10 are output. Counter 50 counts up/down according to the input counter control signal ADD, as will be described afterwards. Counter 50 generates a smallest address signal CMIN by NAND gates 513–515 according to generated addresses a0–a5. Signal CMIN is provided to counter control circuit 40.

Figure 11:
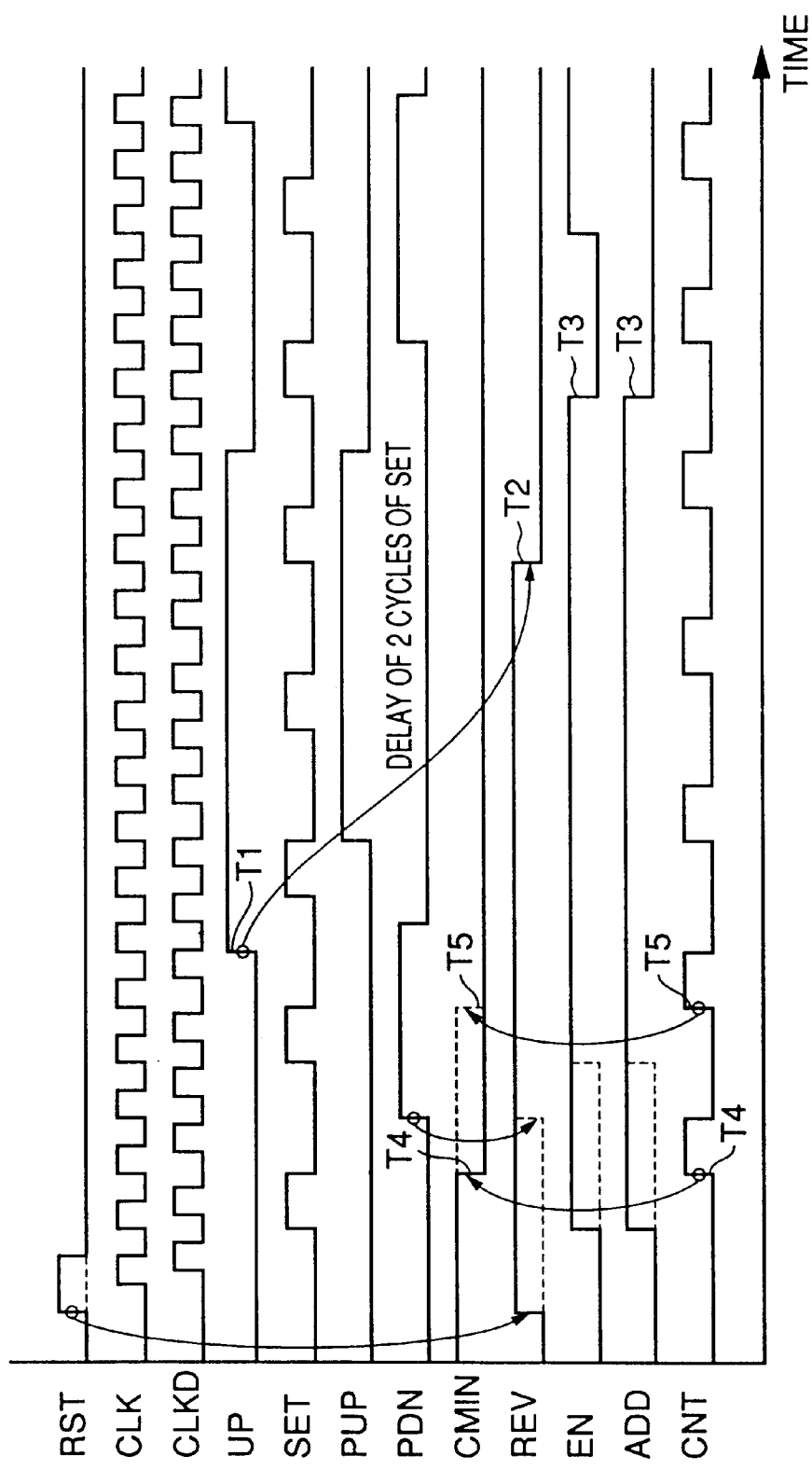
FIG. 11 is a timing chart of a phase comparator, filter, counter control circuit and counter.
Figure 12:
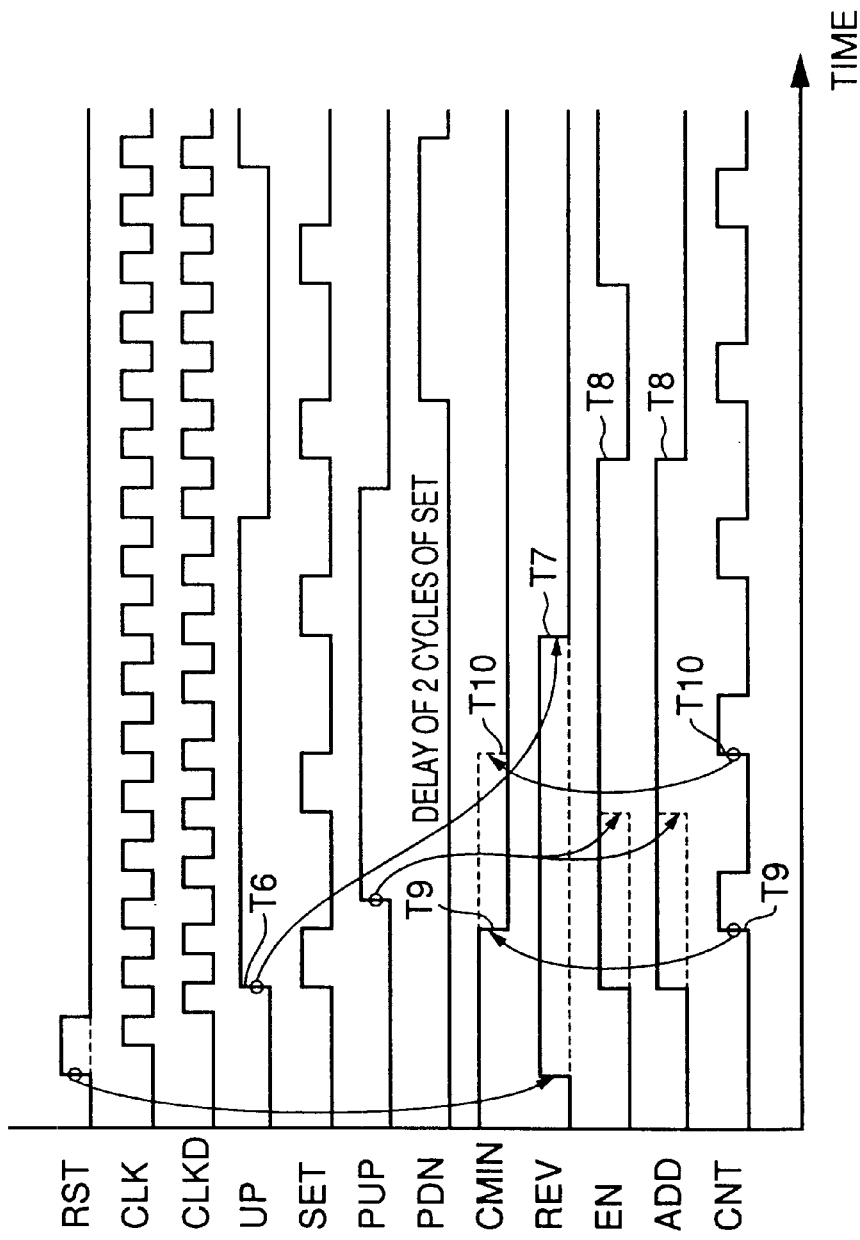
FIG. 12 is a timing chart of a phase comparator, filter, counter control circuit and counter.

Referring to FIGS. 11 and 12, generation of signals REV and /REV, counter control signal ADD and signal EN in counter control circuit 40 of FIG. 7 will be described. FIG. 11 corresponds to reset, or when the comparison result of phase comparator 20 is at an L level in the initial state. When reset signal RST of an H level is input, counter control circuit 40 drives signal REV to an H level in synchronization with the transition timing of reset signal RST from an L level to an H level irrespective of signals PUP and PDN from filter 30 and the value of smallest address signal CMIN from counter 50. Accordingly, clocked inverters 410 and 412 receiving signals PUP and PDN from filter 30 are turned off whereas clocked inverters 411 and 413 are turned on, as shown in FIG. 7. Therefore, counter control circuit 40 generates counter control signal ADD and signal EN of an H level irrespective of the value of signals PUP and PDN.

Following the transition timing T1 of the comparison result of phase comparator 20 from an L level to an H level, counter control circuit 40 drives signal REV to an L level from an H level at a timing T2 corresponding to the elapse of two cycles of control clock SET. Accordingly; docked inverters 410 and 412 receiving signals PUP and PDN from filter 30 are turned on whereas clocked inverters 411 and 413 are turned off, as shown in FIG. 7. Therefore, counter control circuit 40 switches counter control signal ADD and signal EN to an L level from an H level at a timing T3 corresponding to the elapse of one cycle of control clock SET from timing T2 where signal REV is pulled down to an L level from an H level.

Counter 50 initiates counting up from timing T4 of control clock CNT after counter control signal ADD and signal EN of an H level are input. Smallest address signal CMIN switched to an L level from an H level in synchronization with timing T4 is output to counter control circuit 40.

Since addresses a0–a5 take the smallest values when reset signal RST of an H level is not input (indicated by the dotted line in FIG. 11), counter control circuit 40 receives smallest address signal CMIN of an H level from counter 50, and signal PDN pulled up to an H level from an L level corresponding to the comparison result of phase comparator 20 attaining an L level over three cycles of reference clock CLK and signal PUP of an L level. As a result, counter control circuit 40 generates a signal REV that is switched to an H level from an L level in response to the transition of signal PDN to an H level from an L level. More specifically, counter control circuit 40 drives signal REV to an H level from an L level according to signal PDN corresponding to the comparison result of phase comparator 20 when reset signal RST is not input or when addresses a0–a5 take the smallest values and the comparison result of phase comparator 20 is at an L level. Accordingly, counter control circuit 40 generates counter control signal ADD and signal EN of an H level, as described previously. The timing of signal REV switched to an L level from an H level by counter control circuit 40 corresponds to timing T2. In response, counter control circuit 40 drives address control signal ADD and signal EN to an L level from an H level. Signal PDN driven from an L level to an H level corresponds to the signal that causes counter 50 to count down.

Counter 50 initiates count up from timing T5 of control clock CNT after counter control signal ADD and signal EN of an H level are input. Therefore, a smallest address signal CMIN switched to an L level from an H level in synchronization with timing T5 is output to counter control circuit 40.

When reset signal RST of an H level is input, counter control circuit 40 switches signal REV to an H level prevailing over signals PUP and PDN from filter 30 corresponding to the comparison result of phase comparator 20 to generate counter control signal ADD and signal EN of an H level to cause counter 50 to enter a force up mode. When the comparison result of phase comparator 20 attains an H level, counter control signal ADD and signal EN are pulled down to an L level at the elapse of two cycles of control clock SET, whereby the count of counter 50 is canceled from the force up mode. Also in the case where the comparison result of phase comparator 20 is at an L level at the start, counter control circuit 40 forces signal REV to an H level, whereby counter control signal ADD and signal EN of an H level are generated to cause counter 50 to enter the count force up mode. Counter control signal ADD and signal EN are pulled down to an L level at the elapse of two cycles of control clock SET after the comparison result of the phase comparator 20 attains an H level, whereby counter 50 is canceled from the force up mode.

Counter control signal ADD attaining an H level implies that counter control signal ADD is rendered active whereas counter control signal ADD attaining an L level implies that counter control signal ADD is rendered inactive.

FIG. 12 corresponds to the case where the comparison result of phase comparator 20 is at an H level at the start. When reset signal RST of an H level is input in this case, counter control circuit 40 switches signal REV to an H level from an L level irrespective of the values of signals PUP and PDN corresponding to the comparison result of the phase comparator 20. Accordingly, counter control circuit 40 generates counter control signal ADD and signal EN of an H level, as described before.

Counter control circuit 40 switches signal REV to an L level from an H level at timing T7 corresponding to the elapse of two cycles of control clock SET, following timing T6 corresponding to the transition of the comparison result of phase comparator 20 from an L level to an H level. Accordingly, counter control circuit 40 drives counter control signal ADD and signal EN to an L level from an H level at timing T8 corresponding to the elapse of one cycle of control clock SET from timing T7 where signal REV is switched from an H level to an L level.

Counter 50 initiates counting up from timing T9 of control clock CNT, after counter control signal ADD and signal EN of an H level are input. Therefore, a smallest address signal CMIN switched from an H level to an L level in synchronization with timing T9 is provided to counter control circuit 40.

In the case where reset signal RST of an H level is not input (indicated by the dotted line in FIG. 12), counter control circuit 40 receives smallest address signal CMIN of an H level from counter 50, and signal PUP pulled up to an H level from an L level in response to the comparison result of phase comparator 20 attaining an H level over three cycles of reference clock CLK and a signal PDN of an L level, since addresses A0–A5 take the smallest values. As a result, counter control circuit 40 generates signal REV of an L level. Accordingly, counter control circuit 40 drives counter control signal ADD and signal EN to an H level from an L level according to signal PUP switched from an L level to an H level since clocked inverters 410 and 412 are on and clocked inverters 411 and 413 are off, as shown in FIG. 7.

Then, counter control circuit 40 drives counter control signal ADD and signal EN to an L level from an H level at the aforementioned timing T8.

Following the input of counter control signal ADD and signal EN of an H level, counter 50 starts counting up from timing T10 of control clock CNT. Therefore, a smallest address signal CMIN switched to an L level from an H level in synchronization with timing T10 is provided to counter control circuit 40.

When reset signal RST of an H level is input in the case where the comparison result of phase comparator 20 is at an H level, counter control circuit 40 switches signal REV to an H level irrespective of the values of signals PUP and PDN corresponding to the comparison result, whereby counter control signal ADD and signal EN of an H level are generated to cause counter 50 to enter the count force up mode. Counter control signal ADD and signal EN are switched to an L level at the elapse of two cycles of control clock SET after the comparison result of phase comparator 20 attains an H level, whereby counter 50 is canceled from the force up mode. When a reset signal is not applied, counter control circuit 40 will not switch signal REV to an H level from an L level. Counter control signal ADD and signal EN according to signals PUP and PDN corresponding to the comparison result of phase comparator 20 are generated to control the count of counter 50 in a general manner. In the present invention, signal REV is referred to as "force up signal".

The present invention in not limited to counter control circuit 40 switching signal REV to an L level from an H level at the timing of the elapse of two cycles of control clock SET after the comparison result of phase comparator 20 attains an H level. An appropriate value is to be selected taking into consideration the relationship between jitter and the amount of delay. Therefore, counter control circuit 40 may switch signal REV to an L level from an H level at an elapse of three cycles or four cycles of control clock SET. In this case, counter control circuit 40 is formed with one or two additional shift registers connected in series with shift registers 406 and 407.

Figure 13:
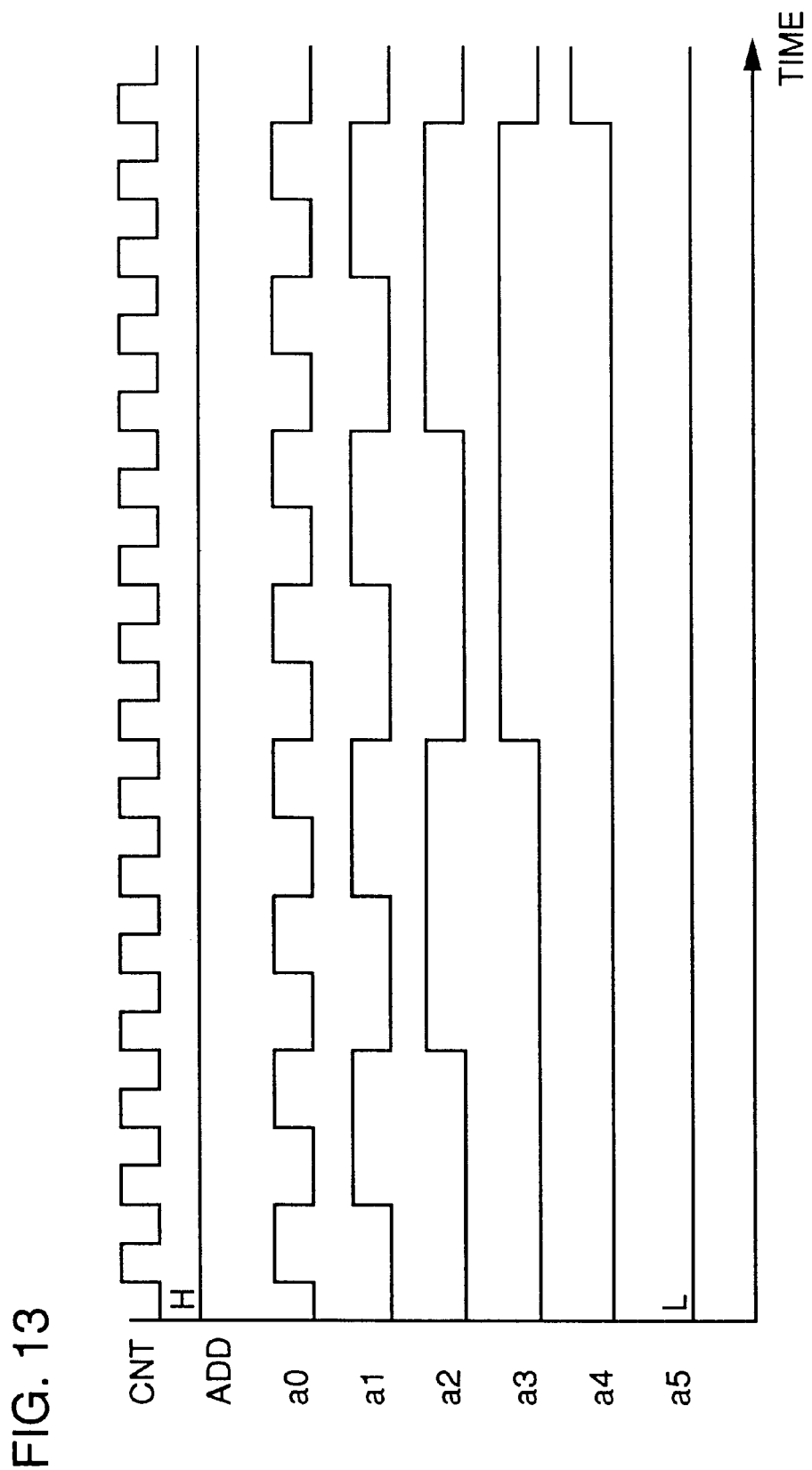
FIGS. 13 and 14 are timing charts of a counter.

The count of addresses a0–a5 by counter 50 will be described with reference to FIGS. 13 and 14. As described before, the counter unit of FIG. 9 outputs a carrier signal C and a data signal D shown in FIG. 10. When reset is specified, counter control circuit 40 generates and provides to counter 50 counter control signal ADD and signal EN of an H level when addresses a0–a5 take the smallest values and the comparison result of phase comparator is at an L level. Therefore, counter control signal ADD of an H level is applied to a terminal UP of counter units 501–506 whereas signal EN of an H level is applied to input terminal IN. As a result, counter 50 generates address signals a0–a5 shown in FIG. 13 at each cycle of control clock CNT. It is apparent from FIG. 13 that counter 50 outputs addresses a0–a5 whose values are gradually increased when counter control signal ADD of an H level is input. Thus, in response to the input of counter control signal ADD of an H level that is a signal to cause counter 50 to proceed to the force up mode, counter 50 counts up the value to output corresponding addresses a0–a5.

Figure 14:
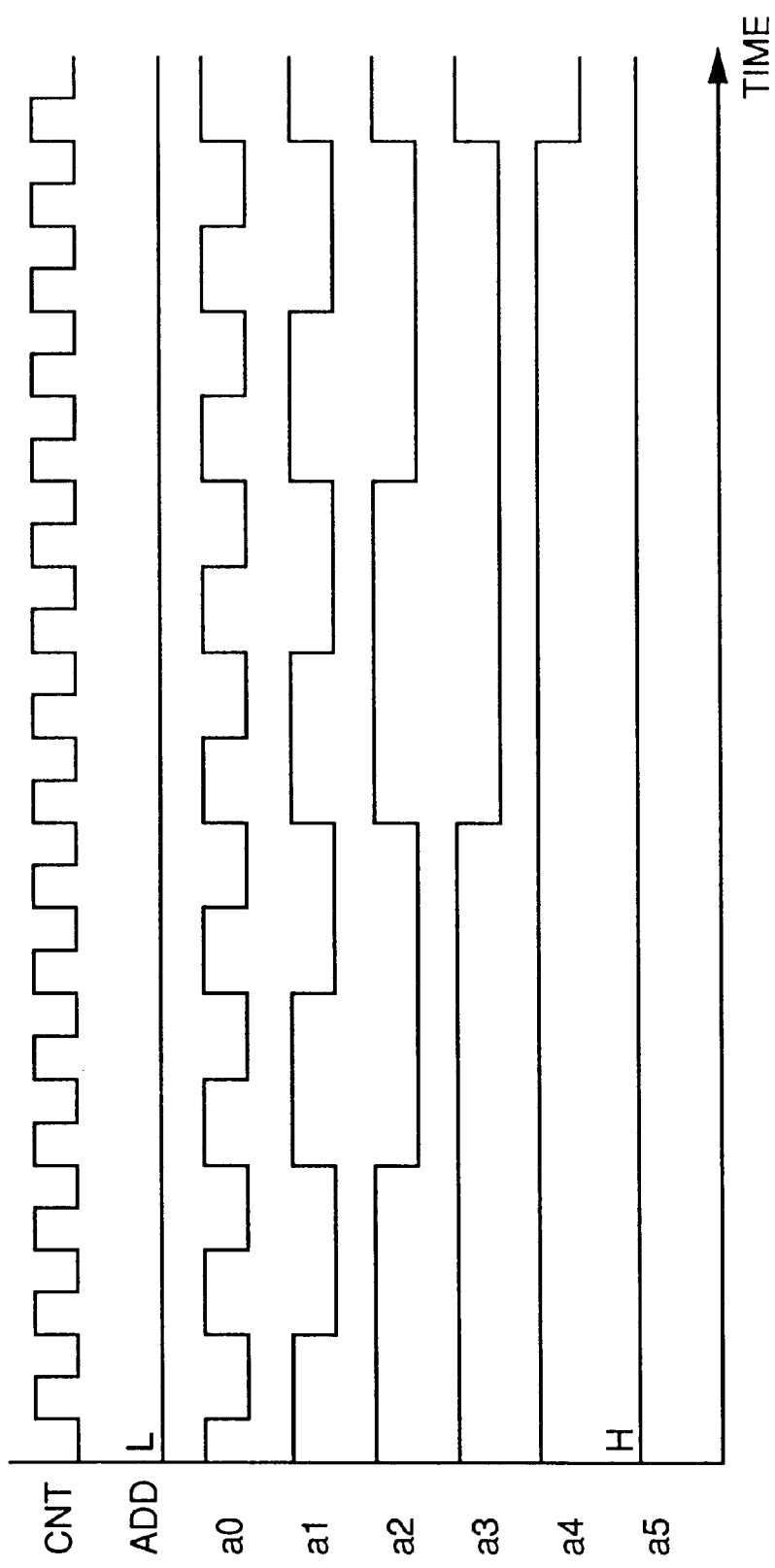

When counter control signal ADD of an L level is applied to counter 50 from counter control circuit 40, a counter control signal ADD of an L level is input to terminal UP of counter units 501–506, whereby addresses a0–a5 shown in FIG. 14 are generated at each cycle of control clock CNT. In response to the input of counter control signal ADD of an L level, counter 50 outputs addresses a0–a5 whose values are gradually reduced.

Figure 15:
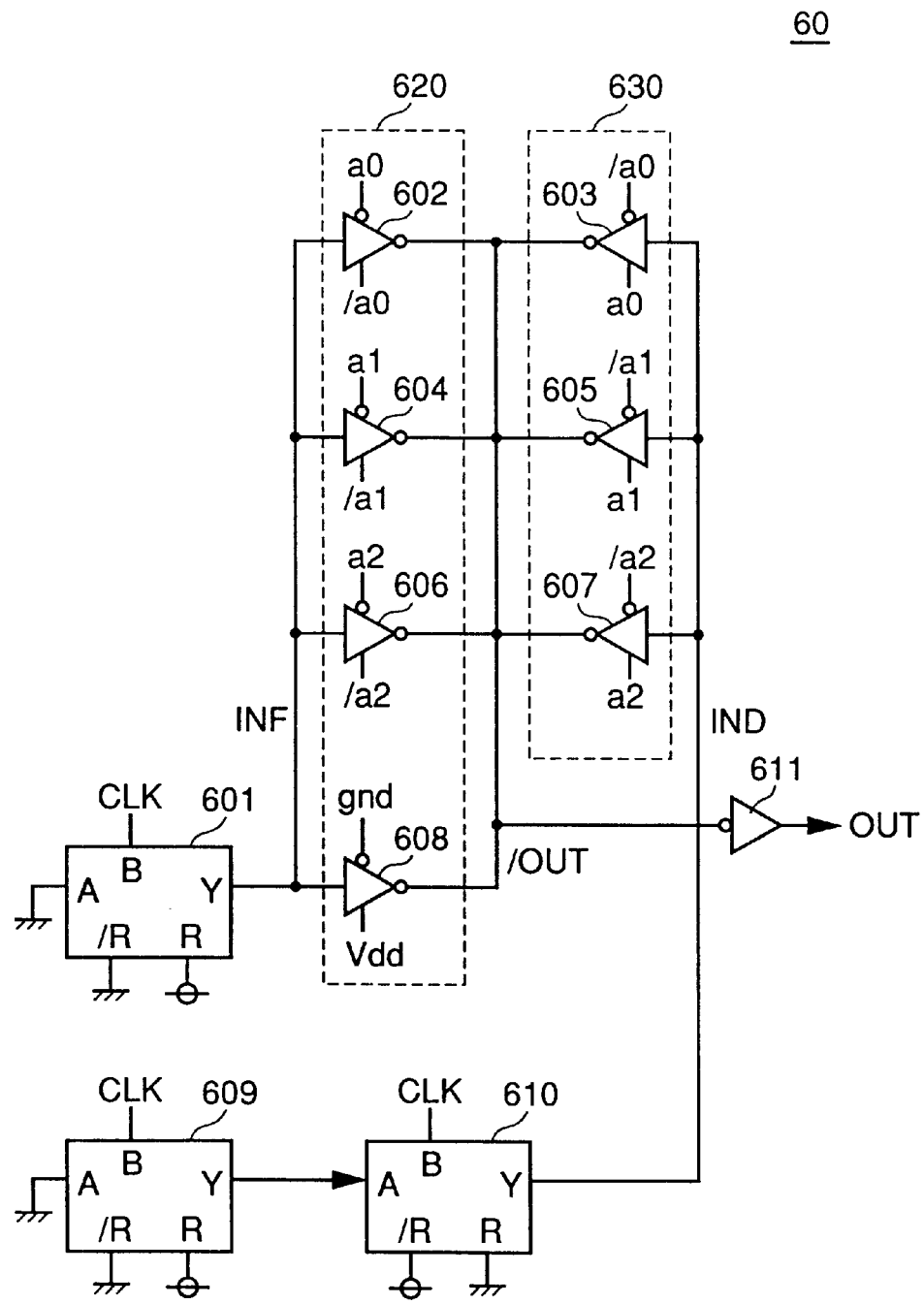
FIG. 15 is a circuit diagram showing a structure of a fine delay circuit of the DLL circuit of FIG. 1.

Referring to FIG. 15, fine delay circuit 60 includes a delay unit 601, clocked inverters 602–608, delay units 609 and 610, and an inverter 611. The output terminal of clocked inverter 602 is connected to the output terminal of clocked inverter 603. The output terminal of clocked inverter 604 is connected to the output terminal of clocked inverter 605. The output terminal of clocked inverter 606 is connected to the output terminal of clocked inverter 607. Clocked inverters 602, 604, 606 and 608 are connected in parallel. Clocked inverters 603, 605 and 607 are also connected in parallel. Clocked inverters 602 and 603 have a size n where the channel widths of the P channel MOS transistor and the N channel MOS transistor (simply referred to as "size" hereinafter) forming the inverters are identical. Clocked inverters 604 and 605 have the same size 2n. Clocked inverters 606 and 607 have the same size 4n. Clocked inverter 608 has size n. Clocked inverters 602 and 603 are driven by addresses a0, /a0 output from counter 50. When clocked inverter 602 is driven, clocked inverter 603 is not driven. When clocked inverter 602 is not driven, clocked inverter 603 is driven. More specifically, clocked inverter 602 and clocked inverter 603 are driven when address a0 is at an L level and an H level, respectively. Clocked inverters 604 and 605 are driven by addresses a1, /a1 output from counter 50. Clocked inverters 606 and 607 are driven by addresses a2, /a2 output from counter 50. The driving method thereof is identical to the driving method of clocked inverters 602 and 603 through addresses a0, /a0.

Figure 16:
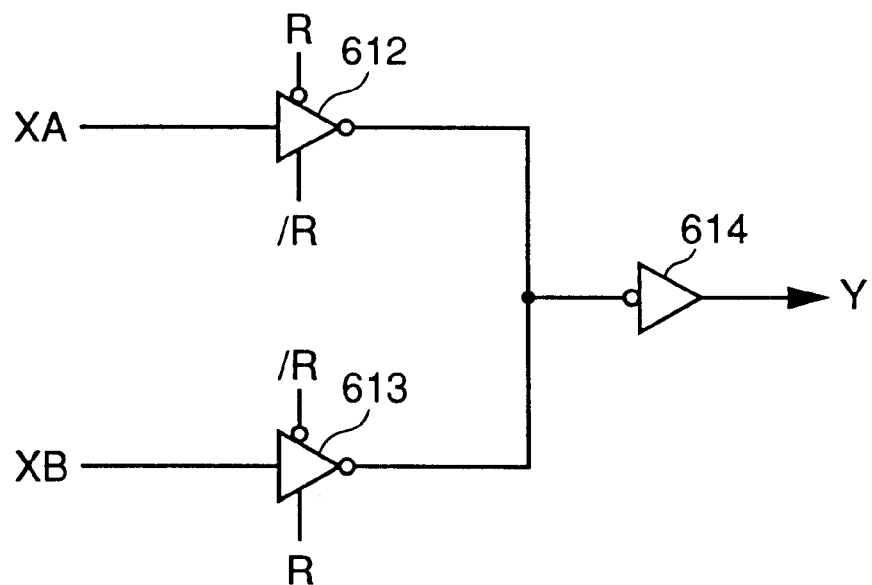
FIG. 16 is a circuit diagram showing a structure of a delay unit of a delay circuit of FIG. 15.

Referring to FIG. 16, each of delay units 601, 609 and 610 includes clocked inverters 612 and 613, and an inverter 614. Clocked inverter 612 is driven when signal R is at an L level to function as an inverter with respect to an input signal XA. In this case, clocked inverter 613 is not driven. Clocked inverter 613 is driven when signal R is at an H level to function as an inverter with respect to an input signal XB. In this case, clocked inverter 612 is not driven. Therefore, clocked inverter 612 or 613 is driven depending upon whether signal R is at an L level or an H level. Input signal XA or input signal XB is inverted to be applied to inverter 614. The inverted signal is further inverted by inverter 614 to be provided as an output signal Y. Therefore, delay units 601, 609 and 610 serve to delay the phases of input signals XA and XB by a predetermined amount T.

Referring to FIG. 15 again, delay unit 601 delays the phase of the input reference clock CLK by a predetermined amount T to output a signal INF since signal R is at an H level and signal /R is at an L level. Similarly, delay unit 609 delays the phase of input reference clock CLK by a predetermined amount T to output a signal Y. Delay unit 610 delays the phase of input signal XA (Y) by a predetermined amount T to output a signal IND since signal R is at an L level and signal /R is at an H level. As a result, signal INF corresponds to a signal having the phase of reference clock CLK delayed by a predetermined amount T. Signal IND is a signal corresponding to the delay of the phase of reference clock CLK by a predetermined amount T×2. Therefore, the phase difference between signals INF and IND corresponds to a predetermined amount T.

Clocked inverters 602–607 are selectively rendered active by addresses a0–a2 output from counter 50. When the address output from counter 50 is a0=a1=a2=0, clocked inverters 602, 604, 606 and 608 are rendered active. Therefore, the combined size Wf of clocked inverters 602, 604, 606 and 608 connected in parallel becomes $w_f=n+2n+4n+n=8n$. In this case, clocked inverters 603, 605 and 607 are not rendered active. Therefore, the combined size $W_d$ of clocked inverters 603, 605 and 607 connected in parallel is 0.

When the address is a0=a1=a2=1, clocked inverters 602, 604 and 606 are not rendered active. Clocked inverters 603, 605, 607 and 608 are rendered active. As a result, combined size $w_f=n$ and combined size $W_d=7$. The following Table 1 shows the calculated combined sizes $w_f$ and $w_d$ with respect to all addresses a0–a2.

TABLE 1

| a0 | a1 | a2 | Wf | Wd |
|----|----|----|----|----|
| 0 | 0 | 0 | 8n | 0 |
| 1 | 0 | 0 | 7n | n |
| 0 | 1 | 0 | 6n | 2n |
| 1 | 1 | 0 | 5n | 3n |
| 0 | 0 | 1 | 4n | 4n |
| 1 | 0 | 1 | 3n | 5n |
| 0 | 1 | 1 | 2n | 6n |
| 1 | 1 | 1 | n | 7n |

Thus, combined size $w_f$ varies from 8n to n with respect to addresses a0–2, whereas combined size $w_d$ varies from 0 to 7n with respect to addresses a0–a2. Therefore, clocked inverters 602, 604, 606 and 608 connected in parallel can be thought of as one clocked inverter circuit 620 whose size varies from 8n to n for addresses a0–a2. Clocked inverters 603, 605 and 607 connected in parallel can be thought of as one clocked inverter circuit 630 whose size varies from 0 to 7n for addresses a0–a2.

Figure 17:
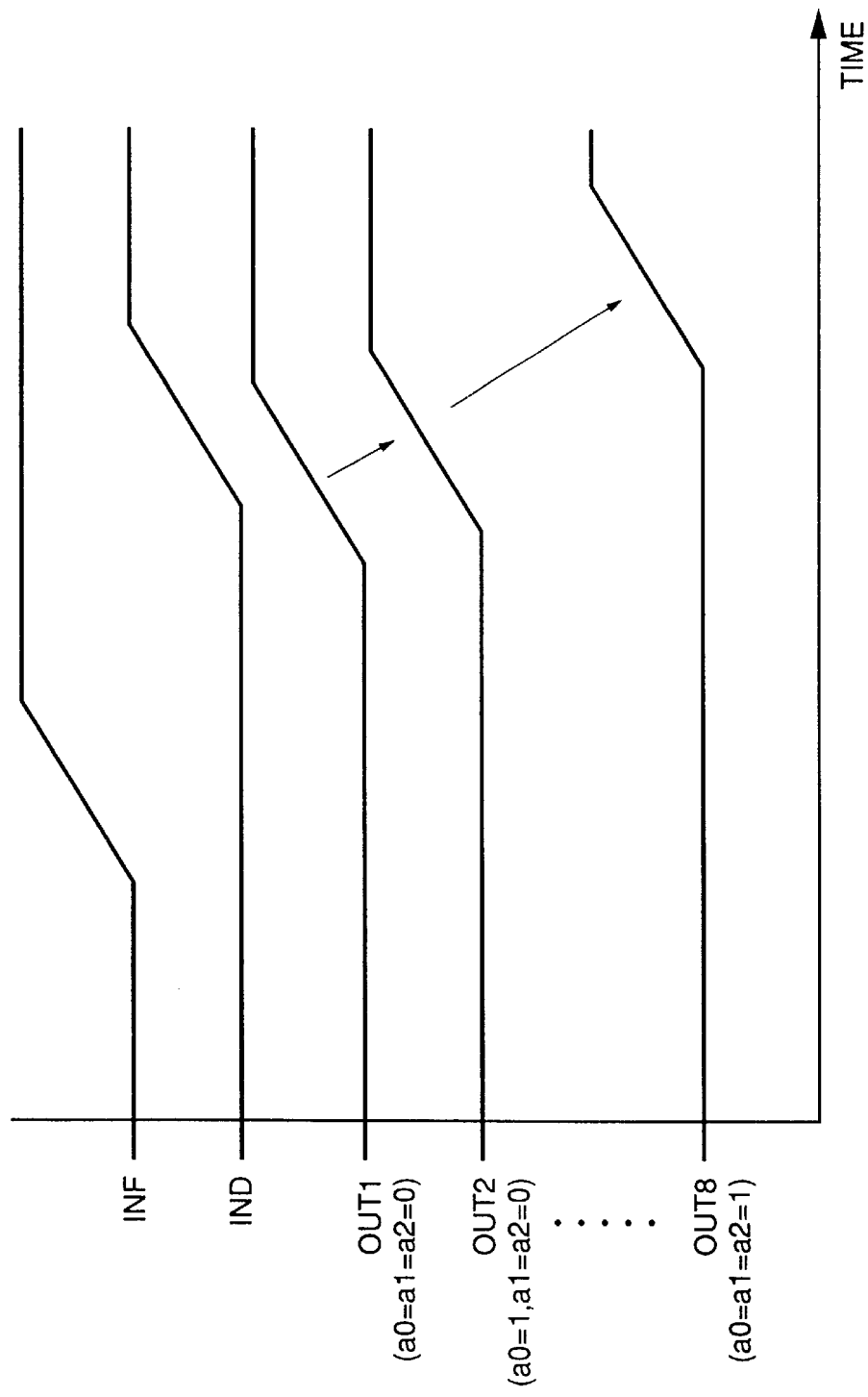
FIG. 17 is a timing chart showing an operation of a fine delay circuit of FIG. 15.

Referring to FIG. 17, in the case where signal INF is applied to clocked inverter circuit 620 and signal IND is applied to clocked inverter circuit 630 when the address is a0=a1=a2=0, a signal OUT1 is output. When the address is a0=1, a1=a2=0, a signal OUT2 is output. When the address is a0=a1=a2=1, a signal OUT8 is output. Therefore, signals OUT1, OUT2, . . . , OUT8 having a phase determined by the ratio of the combined size $w_f$ of clocked inverter circuit 620 to the combined size wd of clocked inverter circuit 630 are output. As a result, signals OUT1, OUT2, . . . , OUT8 whose phase change linearly can be output by addresses a0–a2 from fine delay circuit 60.

Figure 18:
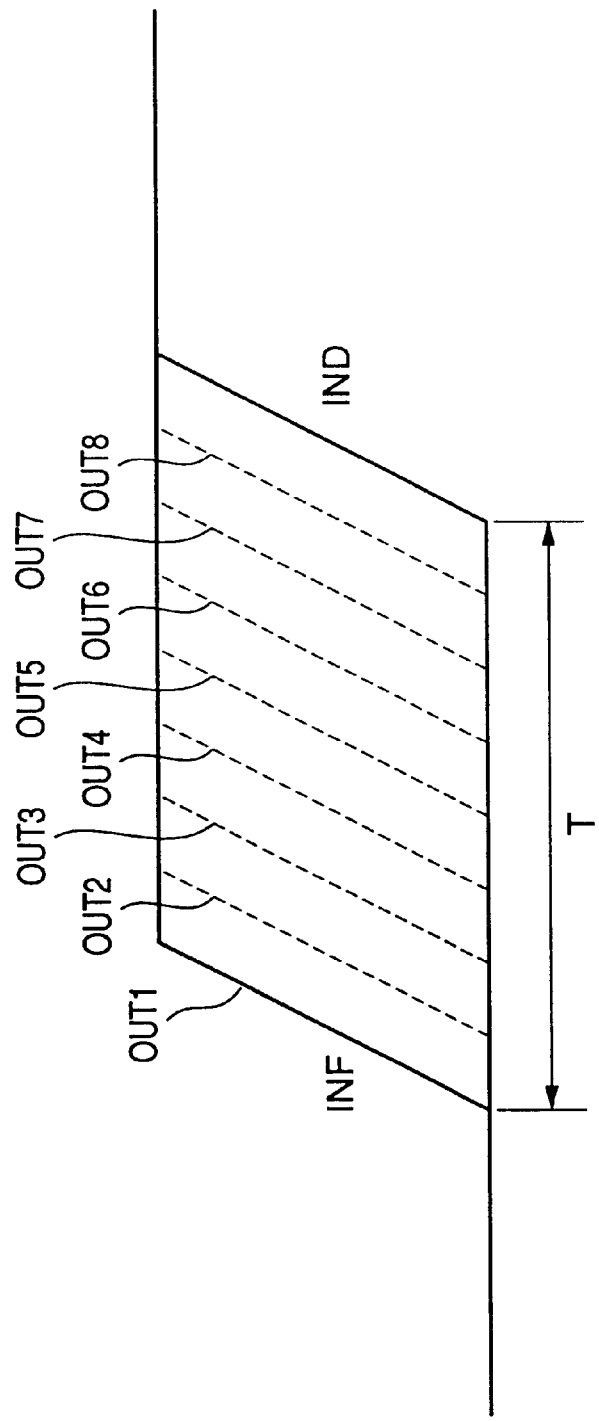
FIG. 18 is a diagram to describe the phase change within a predetermined range by the fine delay circuit of FIG. 15.

When combined size $w_f$ is 8n and combined size $w_d$ is 0, signal OUT1 is output. Therefore, signal OUT1 corresponds to signal INF. Referring to FIG. 18, signals OUT2, OUT3, OUT4, OUT5, OUT6, OUT7 and OUT8 whose phases are present between signal INF and signal IND having a phase difference of a predetermined amount T with respect to signal INF are output from fine delay circuit 60.

The above-described output of signals OUT1, OUT2, . . . , OUT8 whose phase changes depending upon the ratio of combined size $w_f$ of clocked inverter 620 to combined size $w_d$ of clocked inverter 630 determined by addresses a0–a2 corresponds to the input of two signals INF and IND having the phase difference of a predetermined amount T and the output of signals OUT1–OUT8 whose phase changes with the weight to signals INF and IND altered by the combined sizes wf and $w_d$ determined by addresses a0–a2.

The present invention is not limited to the above-described fine delay circuit 60 that generates signals INF and IND having a phase difference of a predetermined amount T by delaying reference clock CLK. The phase of reference dock CLK can lead or lag to generate two signals INF and IND having a phase difference of a predetermined amount T.

Figure 19:
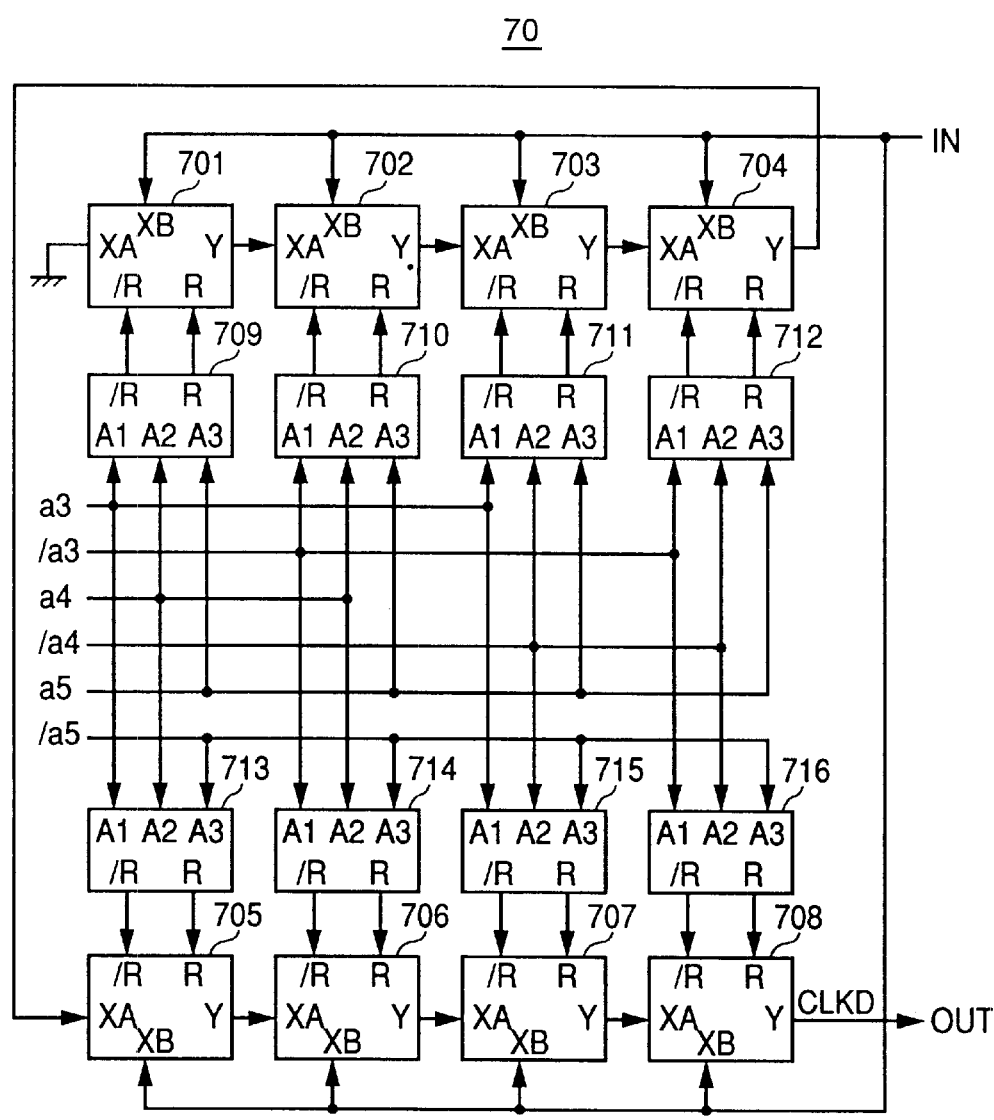
FIG. 19 is a circuit diagram showing a structure of a coarse delay circuit of the DLL circuit of FIG. 1.
Figure 20:
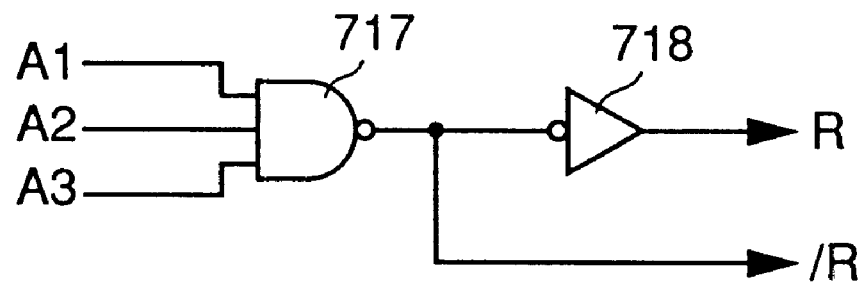
FIG. 20 is a circuit diagram showing a structure of each decoder in the coarse delay circuit of FIG. 19.
Figure 21:
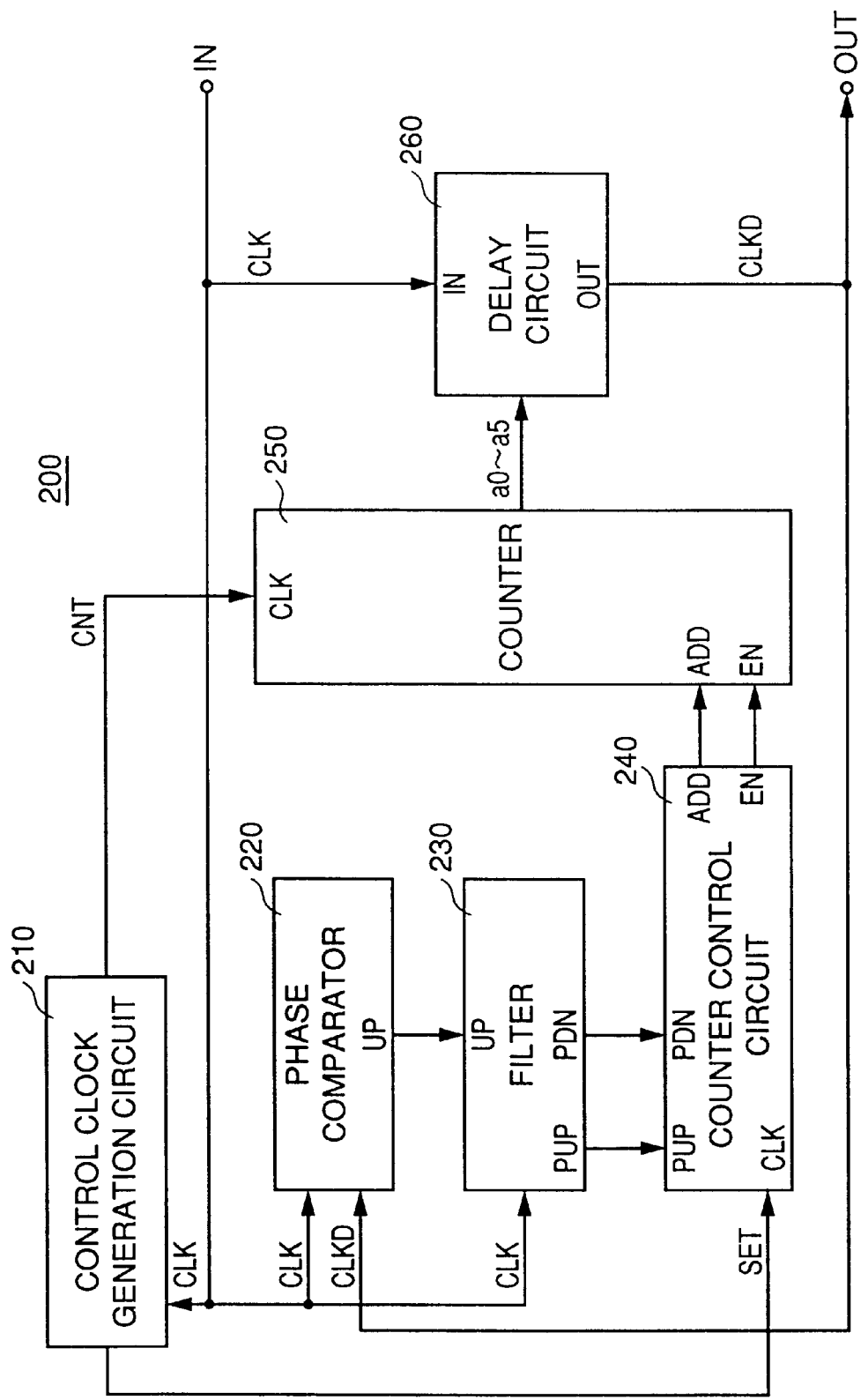
FIG. 21 is a schematic block diagram of a conventional DLL circuit.
Figure 22:
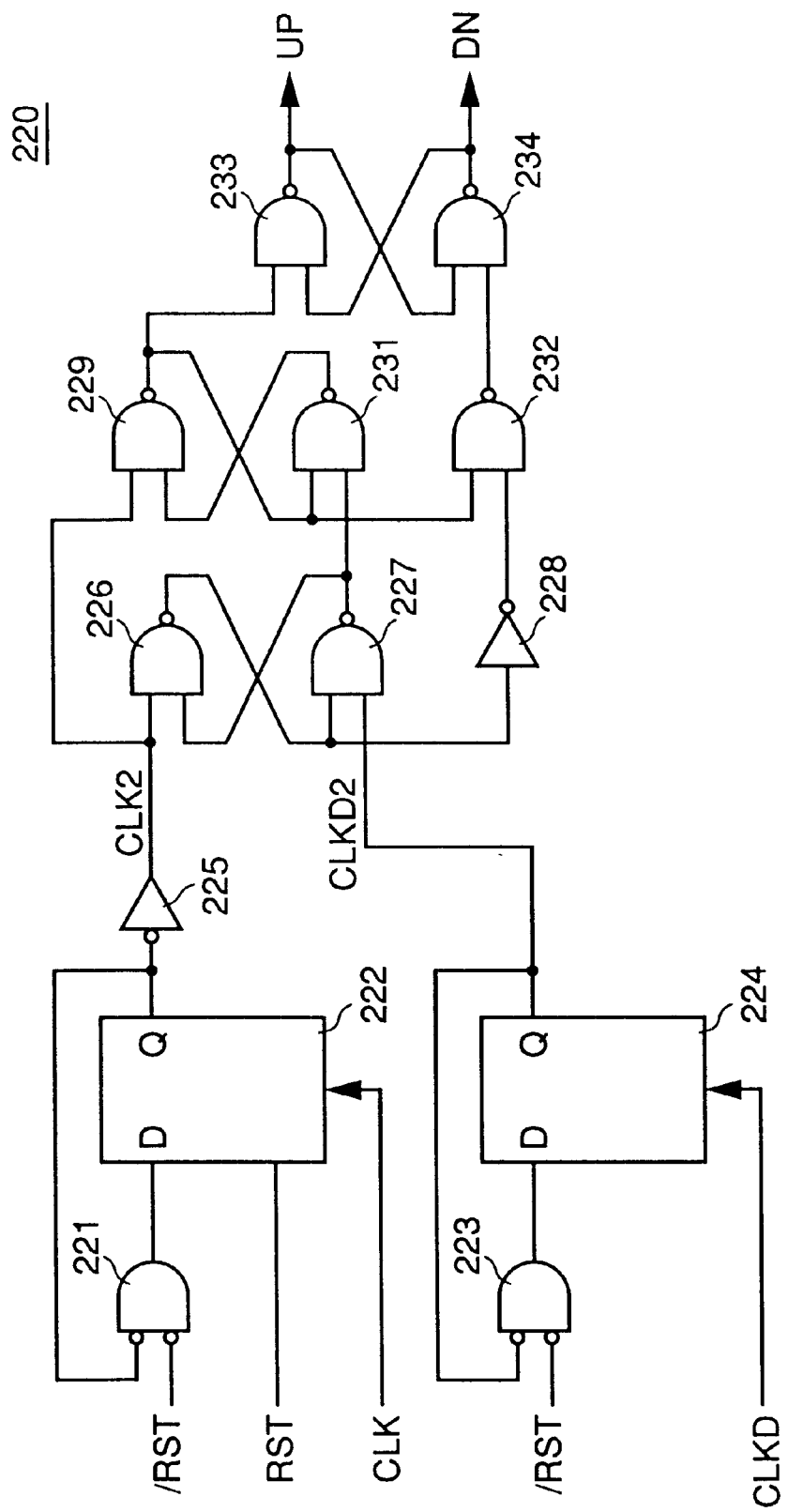
FIG. 22 is a circuit diagram showing a structure of a phase comparator of the DLL circuit of FIG. 21.
Figure 23:
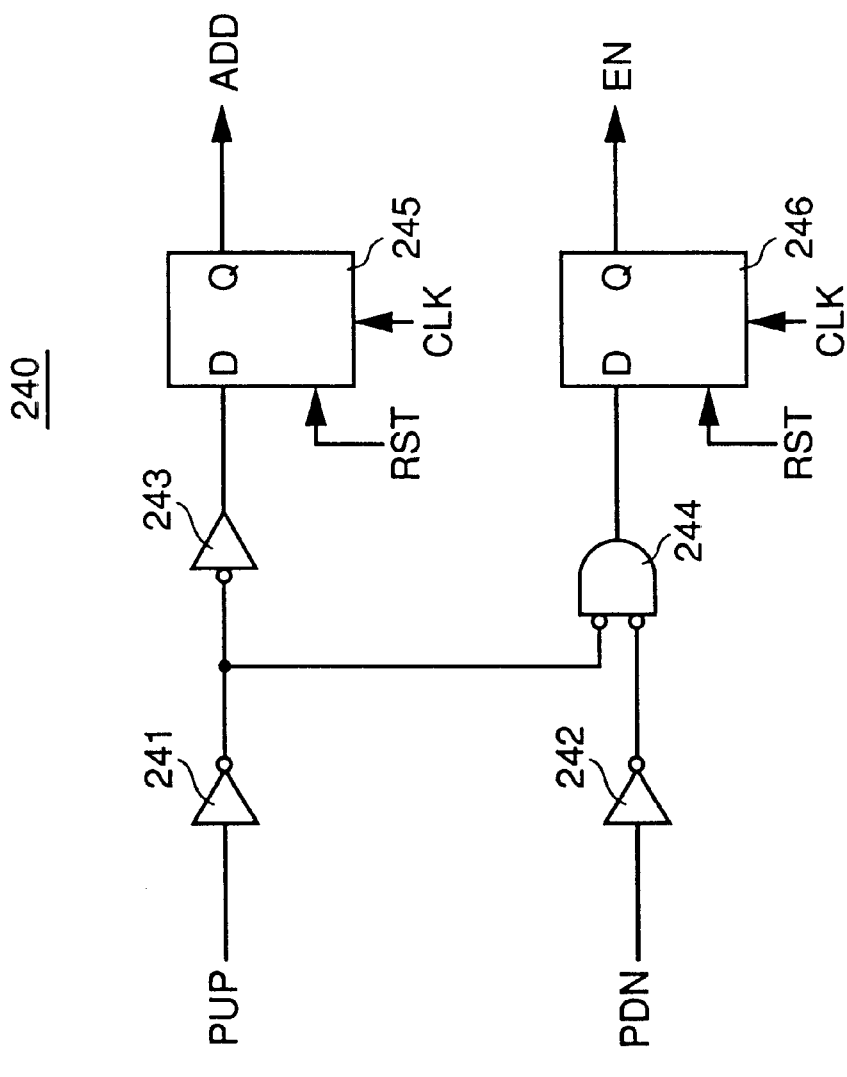
FIG. 23 is a circuit diagram showing a structure of a counter control circuit of the DLL circuit of FIG. 21.
Figure 24:
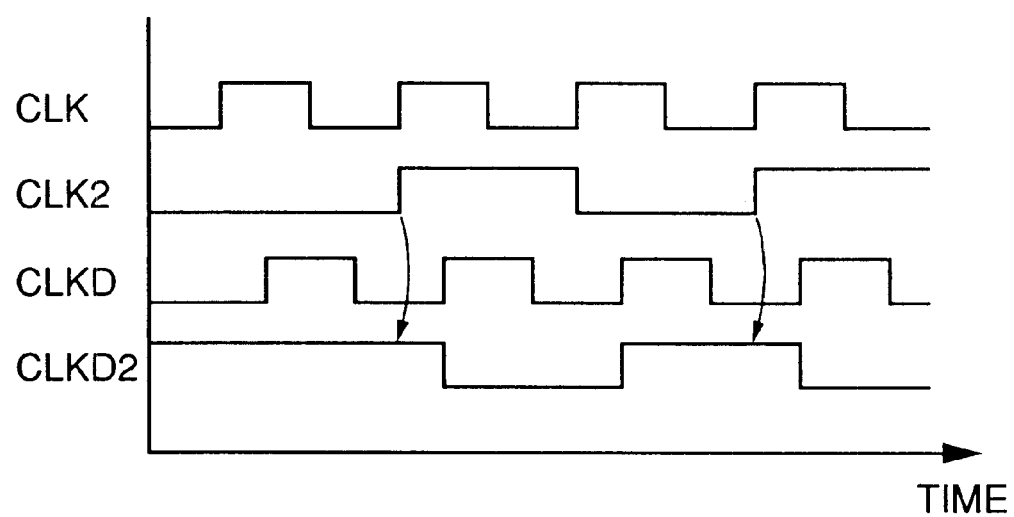
FIGS. 24 and 25 are timing charts of the phase comparator of FIG. 22.
Figure 25:
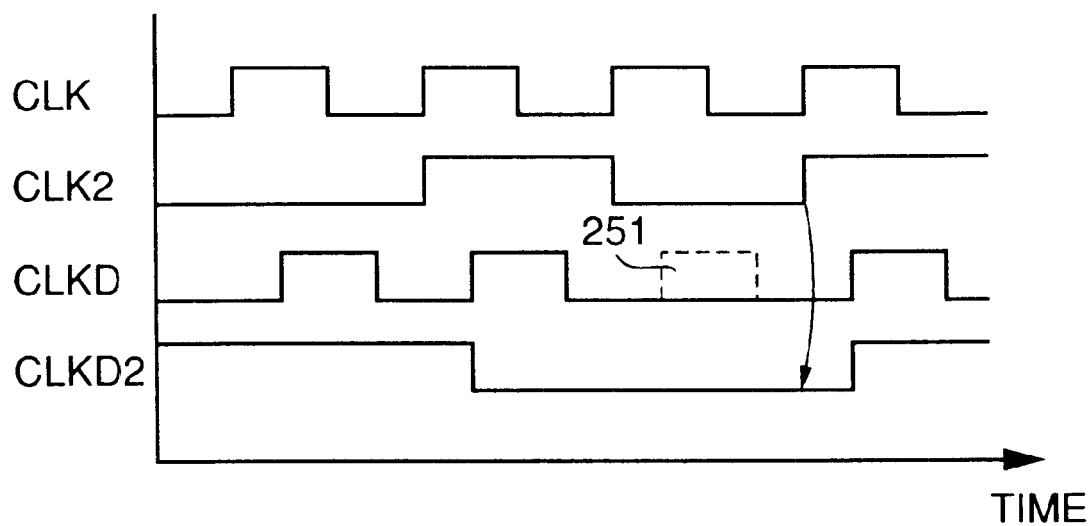

Referring to FIG. 19, coarse delay circuit 70 includes delay units 701–708, and decoders 709–716. Delay units 701–708 have a structure similar to that of units 601, 609 and 610 shown in FIG. 16, and function to delay the phase of input signals XA and XB by a predetermined amount T. Each of decoders 709–716 includes a 3-input NAND gate 717 and an inverter 718 as shown in FIG. 20. Decoders 709–716 output signals R and /R according to input signals A1, A2 and A3.

Referring to FIG. 19 again, decoders 709–716 receive addresses a3–a5 from counter 50 to generate signals R and /R to delay units 701–708. Delay units 701–708 delay input signal XA and input signal XB by a predetermined amount T when signal R is at an L level and an H level, respectively. Therefore, coarse delay circuit 70 determines the number of stages of delay units 701–708 that delay the phase of fine adjustment clock CLKB input from decoders 709–716 to delay the phase of fine adjustment clock CLKB corresponding to the determined number of stages. For example, when the address is a3=0, a4=1 and a5=0, decoders 709, 710, 711, 712, 713, 715 and 716 provide a signal R of an L level and a signal /R of an H level, whereas decoder 714 provides a signal R of an H level and a signal /R of an L level. As a result, delay units 701–705, 707 and 708 delay the phase of input signal XA by a predetermined amount T, whereas delay unit 706 delays the phase of input signal XB by a predetermined amount T. Since input signal XA of the first stage delay unit 701 is always at an L level, delay units 701–705 do not delay the phase of input fine adjustment clock CLKB. Each of delay units 706–708 delays the phase of fine adjustment clock CLKB by a predetermined amount T. Therefore, when the address is a3=0, a4=1 and a5=0, fine adjustment clock CLKB has its phase delayed by a predetermined amount T×3 through the three stages of delay units 706, 707 and 708, whereby delay clock CLKD is output.

When a reset signal RST is input or when the phase comparator exhibits a comparison result of an L level with addresses a0–a5 taking the smallest values in DLL circuit 100, the count is forced up in counter 50 to output addresses a0–a5 stably, whereby delay clock CLKD is set in phase with reference clock CLK according to the output addresses a0–a5.

The above-described DLL circuit 100 is applicable to a semiconductor integrated circuit of high speed response such as a DRAM having memory cells arranged in an array.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A DLL circuit comprising:

a control clock generation circuit generating a first control clock according to a reference clock and a second control clock having a phase difference with respect to set first control clock;

a phase comparator comparing a phase of a delay clock with the phase of the reference clock;

a filter providing a control signal applied with weight corresponding to a comparison result of said phase comparator;

a counter control circuit driven in synchronization with said first control clock to generate a counter control signal according to said control signal;

a counter driven in synchronization with said second control clock to count up/down according to said counter control signal, providing first and second addresses and a smallest address signal that is rendered active when said first and second addresses take the smallest values, and sets the address to the smallest value at a reset signal;

a first delay circuit generating first and second signals having a phase difference of a predetermined amount according to said reference clock, and generating a fine adjustment clock whose phase is present between the phase of said first signal and the phase of said second signal according to said generated first and second signals and said first address; and a second delay circuit delaying said fine adjustment clock by an integral multiple of said predetermined amount to output said delay clock according to said second address;

said counter control circuit providing a counter control signal rendered active to force said counter to count up when said reset signal is input, or when an activated smallest address signal and an output signal of said filter that causes said counter to count down are input.

2. The DLL circuit according to claim 1, wherein said counter control circuit generates a force up signal rendered active according to said reset signal or an output signal of said filter that causes said counter to count down, and renders said counter control signal active according to said generated force up signal.

3. The DLL circuit according to claim 2, wherein said counter control circuit renders said force up signal inactive at an elapse of two cycles of said first control clock from activation of the output of said filter that causes said counter to count up.

4. The DLL circuit according to claim 1, wherein said first delay circuit generates said fine adjustment clock by applying weight to said first and second signals according to said first address.

5. The DLL circuit according to claim 4, wherein said first delay circuit comprises a first inverter circuit applying weight to said first signal by determining a size, and a second inverter circuit having an output terminal connected to an output terminal of said first inverter circuit, and applying weight to said second signal by determining the size, said counter providing to said first delay circuit said first address to determine the size of said first and second inverter circuits.

6. The DLL circuit according to claim 1, wherein said first delay circuit comprises a plurality of first inverters connected in parallel, each having a different size, and a plurality of second inverters connected in parallel, having an output terminal connected to an output terminal of said plurality of first inverters, each second inverter having a different size, said counter providing to said first delay circuit said first address to selectively render said first and second inverters active.

7. A DLL circuit comprising:

a control clock generation a first control clock according to a reference clock and a second control clock having a phase difference with respect to said first control clock;

a phase comparator comparing a phase of a delay clock with the phase of the reference clock;

a counter control circuit driven in synchronization with said first control clock to generate a counter control signal according to a control signal generated by a comparison result of said phase comparator;

a counter driven in synchronization with said second control clock to count up/down according to said counter control signal, providing a count value as an address, and setting the address to a smallest value in response to a reset signal; and a delay circuit delaying said reference clock according to said address to output said delay clock;

said counter control circuit providing a counter control signal rendered active to force said counter to count up when said reset signal is input.

8. The DLL circuit according to claim 7, wherein said counter control circuit generates a force up signal rendered active according to said reset signal, and renders said counter control signal active according to said generated force up signal.

9. The DLL circuit according to claim 7, wherein said control signal is applied with weight corresponding to a comparison result of said phase comparator.

10. The DLL circuit according to claim 7, wherein said delay circuit comprise:

a first delay circuit adjusting a phase of said reference clock with a first delay width, and a second delay circuit adjusting the phase of said reference clock with a second delay width that is larger than said first delay width.

11. A DLL circuit comprising:

a control clock generation circuit generating a first control clock according to a reference clock and a second control clock having a phase difference with respect to said first control clock;

a phase comparator comparing a phase of a delay clock with the phase of the reference clock;

a counter control circuit driven in synchronization with said first control clock to generate a counter control signal according to a control signal generated by a comparison result of said phase comparator;

a counter driven in synchronization with said second control clock to count up/down according to said counter control signal, providing a count value as an address, and providing a smallest address signal that is rendered active when said address takes the smallest value; and a delay circuit delaying said reference clock according to said address to output said delay clock;

said counter control circuit providing a counter control signal rendered active to force said counter to count up when an activated smallest address signal and a control signal that causes said counter to count down are input.

12. The DLL circuit according to claim 11, wherein said counter control circuit generates a force up signal rendered active according to a control signal that causes said counter to count down, and renders said counter control signal active according to said generated force up signal.

13. The DLL circuit according to claim 11, wherein said control signal is applied with weight corresponding to a comparison result of said phase comparator.

14. The DLL circuit according to claim 11, wherein said delay circuit comprises:

a first delay circuit adjusting a phase of said reference clock with a first delay width, and a second delay circuit adjusting the phase of said reference clock with a second delay width that is larger than said first delay width.

* * * * *